(12) United States Patent
Jung et al.

(10) Patent No.: US 9,793,448 B2
(45) Date of Patent: Oct. 17, 2017

(54) LIGHT EMITTING DIODE CHIP HAVING WAVELENGTH CONVERTING LAYER AND METHOD OF FABRICATING THE SAME, AND PACKAGE HAVING THE LIGHT EMITTING DIODE CHIP AND METHOD OF FABRICATING THE SAME

(71) Applicant: Seoul Semiconductor Co., Ltd., Ansan-si (KR)

(72) Inventors: Jung Hwa Jung, Ansan-si (KR); Bang Hyun Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/236,125

(22) Filed: Aug. 12, 2016

(65) Prior Publication Data

US 2016/0351759 A1  Dec. 1, 2016

Related U.S. Application Data

(63) Continuation of application No. 14/173,287, filed on Feb. 5, 2014, now Pat. No. 9,419,186, which is a
(Continued)

(30) Foreign Application Priority Data

May 18, 2010 (KR) .................. 10-2010-0046423
Sep. 15, 2010 (KR) .................. 10-2010-0090352
(Continued)

(51) Int. Cl.
*H01L 33/50* (2010.01)
*H01L 33/06* (2010.01)
(Continued)

(52) U.S. Cl.
CPC ............ *H01L 33/505* (2013.01); *H01L 33/06* (2013.01); *H01L 33/46* (2013.01); *H01L 33/50* (2013.01);
(Continued)

(58) Field of Classification Search
CPC ....... H01L 33/505; H01L 33/46; H01L 33/56; H01L 33/44; H01L 33/50
See application file for complete search history.

(56) References Cited

U.S. PATENT DOCUMENTS 5,813,753 A   9/1998 Vriens et al.
5,834,797 A   11/1998 Yamanaka
(Continued)

FOREIGN PATENT DOCUMENTS

CN   1945867     4/2007
CN   101009351   8/2007
(Continued)

OTHER PUBLICATIONS

Non-Final Office Action issued on Aug. 15, 2012 in U.S. Appl. No. 13/071,666.
(Continued)

*Primary Examiner* — Christine Enad
(74) *Attorney, Agent, or Firm* — H.C. Park & Associates, PLC

(57) ABSTRACT

A light-emitting diode (LED) includes a substrate, a semiconductor stacked structure disposed on the substrate, the semiconductor stacked structure including a first conductivity-type semiconductor layer, an active layer, and a second conductivity-type semiconductor layer, a wavelength converting layer configured to convert a wavelength of light emitted from the semiconductor stacked structure, the wavelength converting layer covering side surfaces of the substrate and the semiconductor stacked structure, and a dis-
(Continued)

tributed Bragg reflector (DBR) configured to reflect at least a portion of light wavelength-converted by the wavelength converting layer, in which at least a portion of the DBR is covered with a metal layer configured to reflect light transmitted through the DBR.

19 Claims, 12 Drawing Sheets

Related U.S. Application Data continuation of application No. 13/071,666, filed on Mar. 25, 2011, now Pat. No. 8,664,635.

(30) Foreign Application Priority Data

Oct. 5, 2010 (KR) .................. 10-2010-0096682
Nov. 8, 2010 (KR) .................. 10-2010-0110149

(51) Int. Cl.
    *H01L 33/46* (2010.01)
    *H01L 33/56* (2010.01)
    H01L 25/075 (2006.01)
    H01L 33/44 (2010.01)

(52) U.S. Cl.
    CPC .......... *H01L 33/56* (2013.01); *H01L 25/0753* (2013.01); *H01L 33/44* (2013.01); *H01L 2224/48091* (2013.01); *H01L 2224/48227* (2013.01)

(56) References Cited

U.S. PATENT DOCUMENTS

| | | | |
|---|---|---|---|
| 6,155,699 A | 12/2000 | Miller et al. | |
| 6,320,206 B1 | 11/2001 | Coman et al. | |
| 6,603,146 B1 | 8/2003 | Hata et al. | |
| 6,720,584 B2 | 4/2004 | Hata et al. | |
| 7,371,603 B2 | 5/2008 | Kim et al. | |
| 7,709,849 B1 | 5/2010 | Kal et al. | |
| 8,598,604 B2 | 12/2013 | Eisert et al. | |
| 2004/0169181 A1 | 9/2004 | Yoo | |
| 2005/0093004 A1* | 5/2005 | Yoo | H01L 33/44 257/79 |
| 2005/0104078 A1* | 5/2005 | Cheng | H01L 33/46 257/98 |
| 2005/0206301 A1 | 9/2005 | Ng | |
| 2005/0224812 A1 | 10/2005 | Liu et al. | |
| 2006/0054905 A1* | 3/2006 | Schwach | H01L 33/08 257/89 |
| 2007/0181912 A1 | 8/2007 | Ikeda et al. | |
| 2007/0254393 A1* | 11/2007 | Johnson | H01S 5/18341 438/38 |
| 2007/0278496 A1 | 12/2007 | Shieh et al. | |
| 2007/0284600 A1* | 12/2007 | Shchekin | H01L 33/46 257/98 |
| 2008/0035942 A1 | 2/2008 | Kim et al. | |
| 2008/0121911 A1 | 5/2008 | Andrews et al. | |
| 2008/0173884 A1* | 7/2008 | Chitnis | H01L 33/44 257/98 |
| 2008/0179609 A1 | 7/2008 | Trottier et al. | |
| 2008/0179611 A1 | 7/2008 | Chitnis et al. | |
| 2008/0185606 A1 | 8/2008 | Sano et al. | |
| 2008/0210958 A1 | 9/2008 | Senda et al. | |
| 2009/0014736 A1 | 1/2009 | Ibbetson et al. | |
| 2009/0057702 A1* | 3/2009 | Chiu | H01L 33/46 257/98 |
| 2009/0097517 A1 | 4/2009 | Sakamoto et al. | |
| 2009/0108250 A1* | 4/2009 | Kim | H01L 33/465 257/13 |
| 2009/0127573 A1 | 5/2009 | Guenther et al. | |
| 2010/0012971 A1 | 1/2010 | Hiraoka et al. | |
| 2010/0052524 A1* | 3/2010 | Kinoshita | H01L 51/5265 313/504 |
| 2010/0105156 A1 | 4/2010 | Chen et al. | |
| 2010/0140648 A1* | 6/2010 | Harada | H01L 33/60 257/98 |
| 2010/0238454 A1* | 9/2010 | Pruessner | G01G 3/165 356/479 |
| 2010/0264441 A1* | 10/2010 | Kim | H01L 33/24 257/98 |
| 2010/0308357 A1* | 12/2010 | Horie | H01L 33/44 257/98 |
| 2011/0188807 A1* | 8/2011 | Fattal | G02B 6/124 385/37 |

FOREIGN PATENT DOCUMENTS

| | | |
|---|---|---|
| CN | 101015069 | 8/2007 |
| EP | 1724848 | 11/2006 |
| JP | H06-186403 | 7/1994 |
| JP | H11-145519 | 5/1999 |
| JP | 2001-501380 | 1/2001 |
| JP | 2001-068734 | 3/2001 |
| JP | 2001-093926 | 4/2001 |
| JP | 2002-118293 | 4/2002 |
| JP | 2002-261325 | 9/2002 |
| JP | 2003-007929 | 1/2003 |
| JP | 2004-095765 | 3/2004 |
| JP | 2004-363342 | 12/2004 |
| JP | 2005-057239 | 3/2005 |
| JP | 2006-005336 | 1/2006 |
| JP | 2006-186022 | 7/2006 |
| JP | 2008-004689 | 1/2008 |
| JP | 2008-166740 | 7/2008 |
| JP | 2008-258334 | 10/2008 |
| JP | 2009-510744 | 3/2009 |
| KR | 10-2000-0076604 | 12/2000 |
| KR | 10-0780182 B1 | 11/2007 |
| KR | 10-0823089 | 4/2008 |
| KR | 10-2008-0056925 | 6/2008 |
| KR | 10-2008-0087251 | 10/2008 |
| KR | 10-2009-0115156 | 11/2009 |
| KR | 10-2010-0003336 A | 1/2010 |
| WO | 2006/034671 | 4/2006 |
| WO | 2009/057655 | 5/2009 |
| WO | 2010/034278 | 4/2010 |

OTHER PUBLICATIONS

Final Office Action issued on Jan. 25, 2013 in U.S. Appl. No. 13/071,666.
Non-Final Office Action issued on May 16, 2013 in U.S. Appl. No. 13/071,666.
Notice of Allowance issued on Oct. 21, 2013 in U.S. Appl. No. 13/071,666.
European Search Report of European Patent Application No. 11 15 9040 issued on Aug. 26, 2011, corresponding to U.S. Appl. No. 13/071,666.
Office Action issued on Jan. 13, 2015, in Chinese Patent Application 201080068136.6.
Examiner's Decision to dismiss amendment issued on Jan. 26, 2016, in Japanese Patent Application No. 2011-096347.
Non-Final Office Action issued on Apr. 3, 2014 in U.S. Appl. No. 14/173,287.
Final Office Action issued on Sep. 18, 2014 in U.S. Appl. No. 14/173,287.
Non-Final Office Action issued on Dec. 31, 2014 in U.S. Appl. No. 14/173,287.
Final Office Action issued on Apr. 10, 2015 in U.S. Appl. No. 14/173,287.
Non-Final Office Action issued on Oct. 23, 2015 in U.S. Appl. No. 14/173,287.
Notice of Allowance issued on Apr. 12, 2016 in U.S. Appl. No. 14/173,287.
Corrected Notice of Allowability issued on Apr. 27, 2016 in U.S. Appl. No. 14/173,287.

(56) References Cited

OTHER PUBLICATIONS

Corrected Notice of Allowability issued on Jun. 15, 2016 in U.S. Appl. No. 14/173,287.

* cited by examiner

[Fig.1]
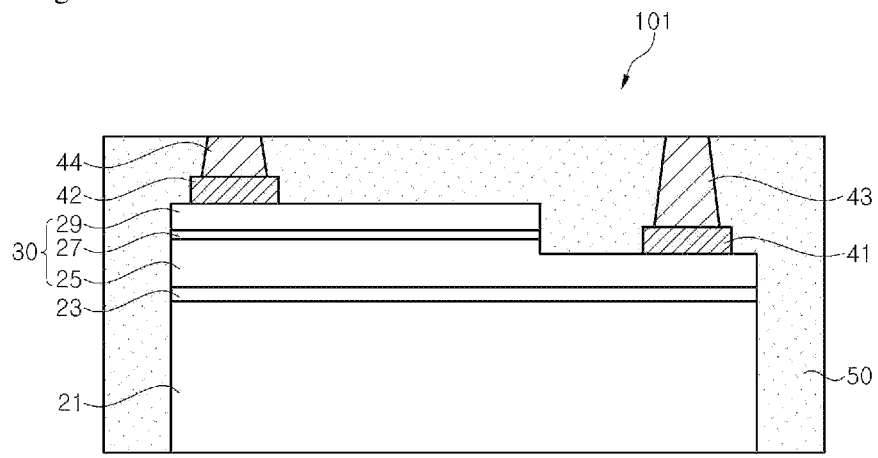
[Fig.2]
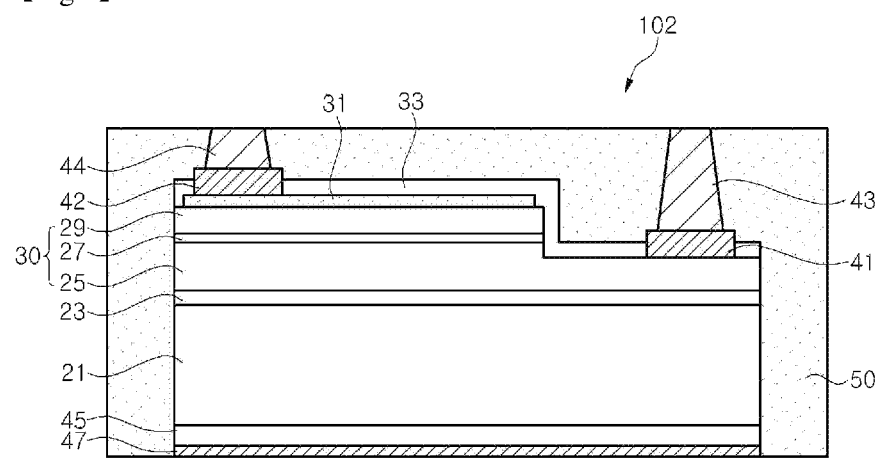
[Fig.3]
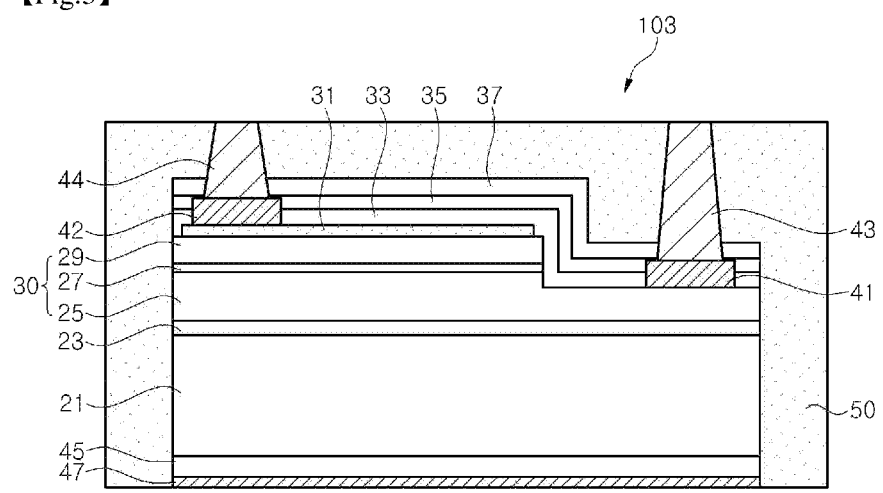

[Fig.4]
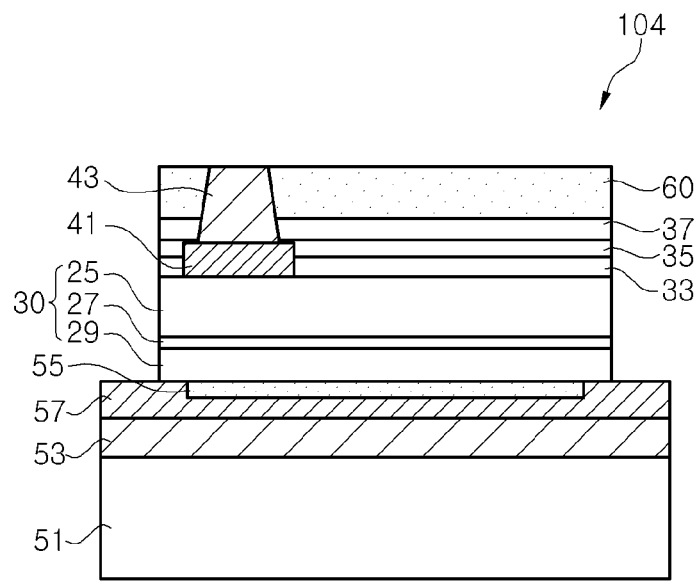
[Fig.5]
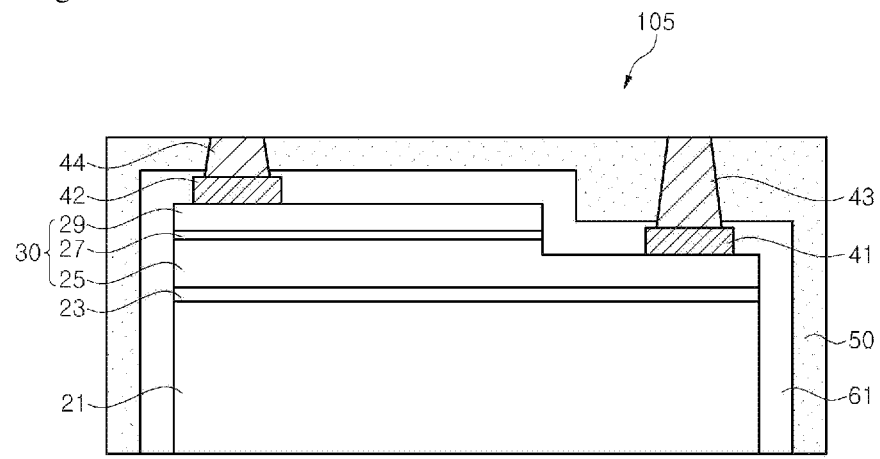
[Fig.6]
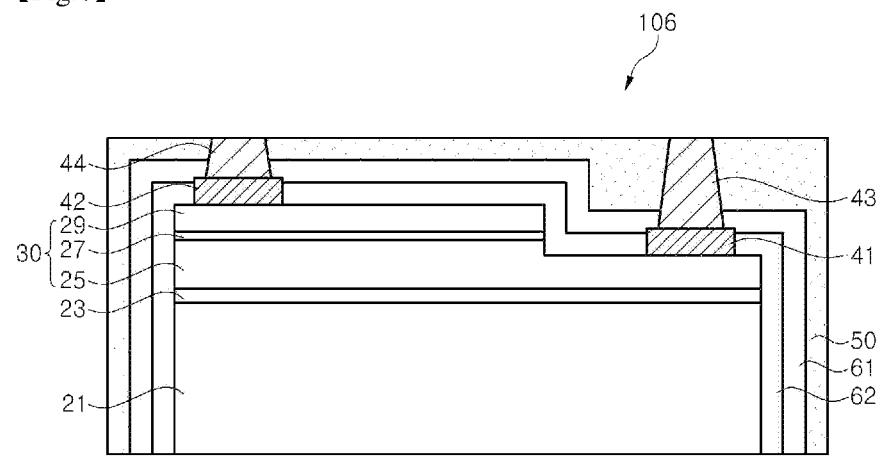

[Fig.7]
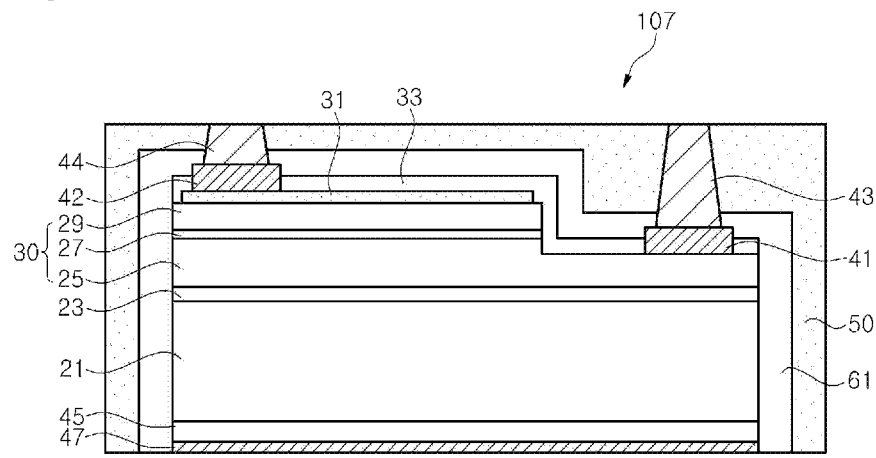
[Fig.8]
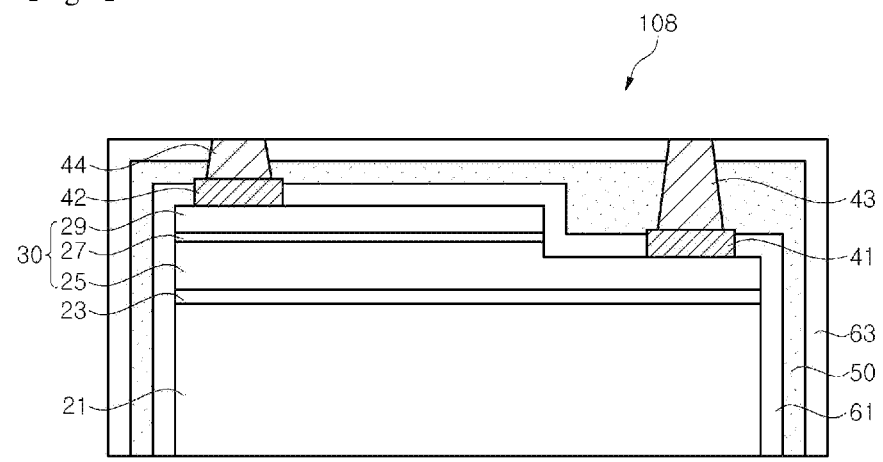
[Fig.9]
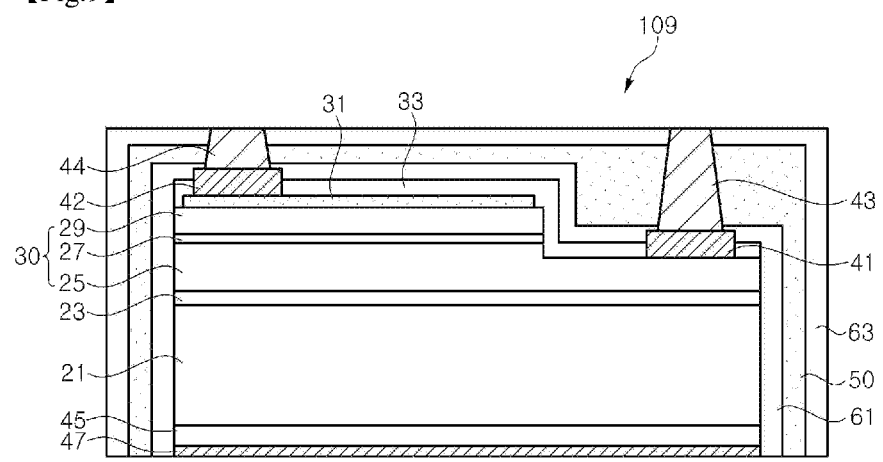

[Fig.10]
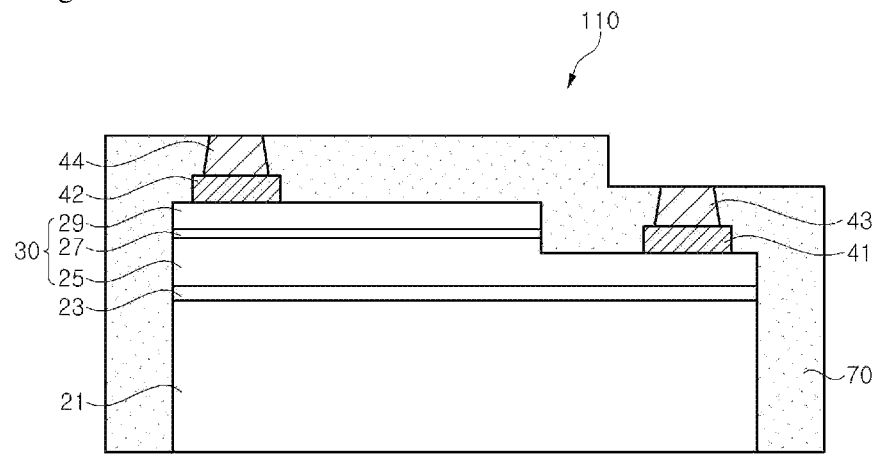
[Fig.11]
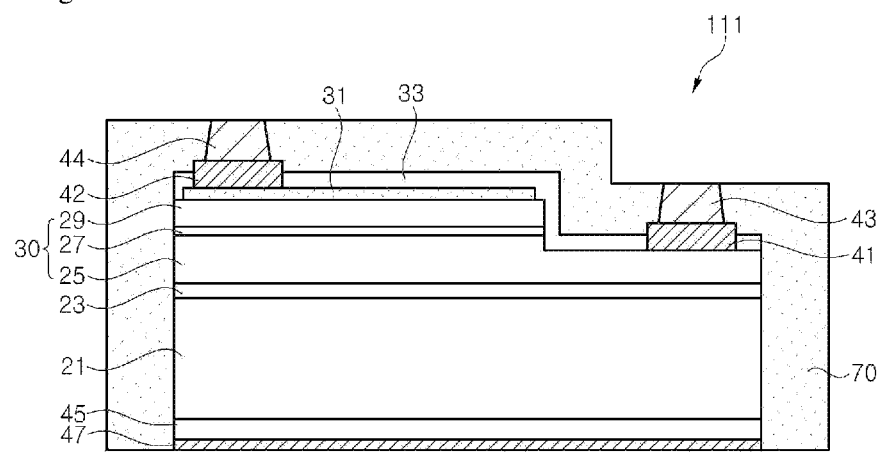
[Fig.12]
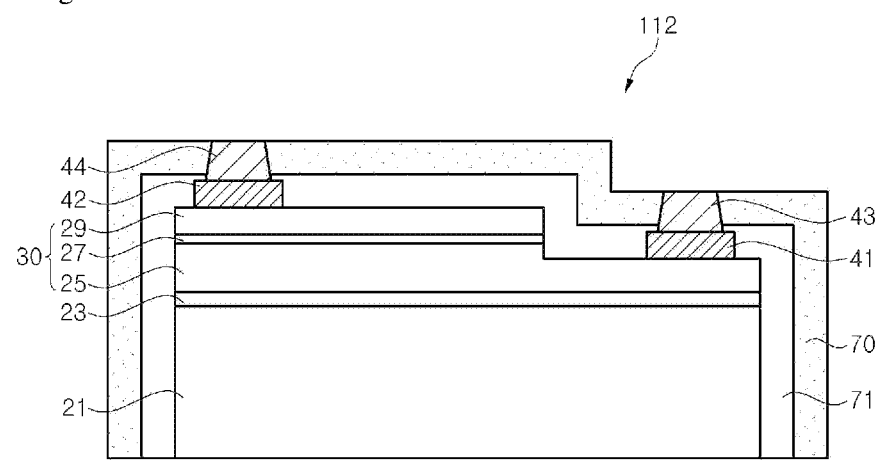

[Fig.13]
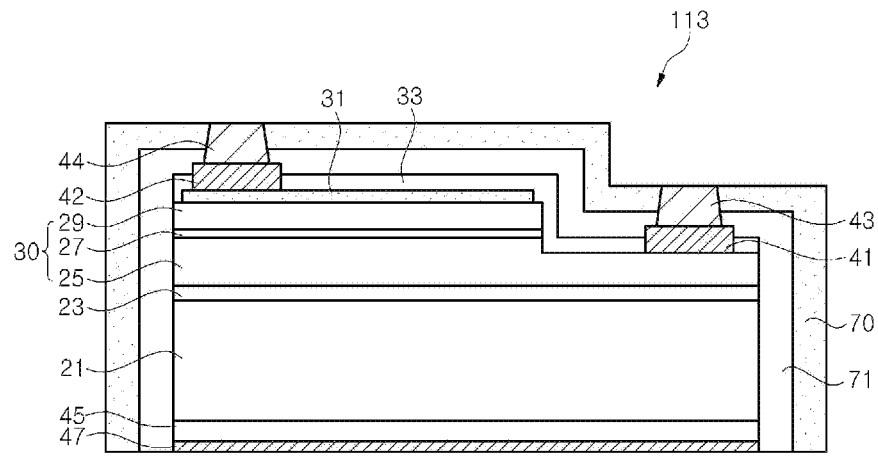
[Fig.14]
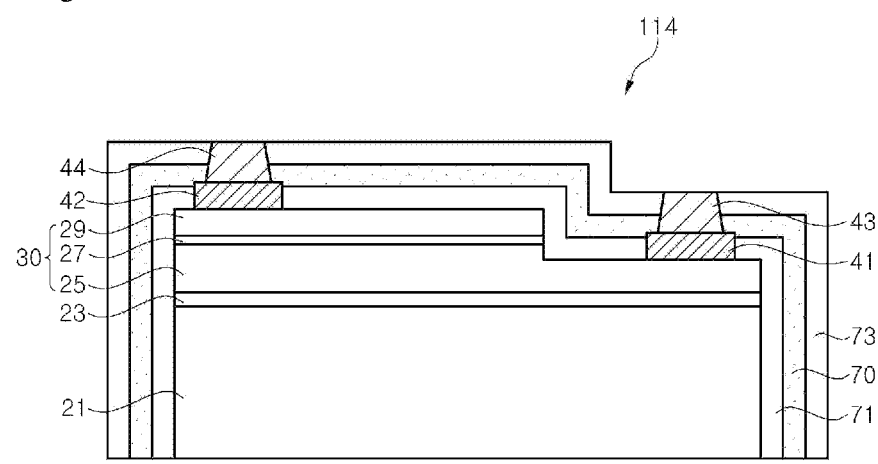
[Fig.15]
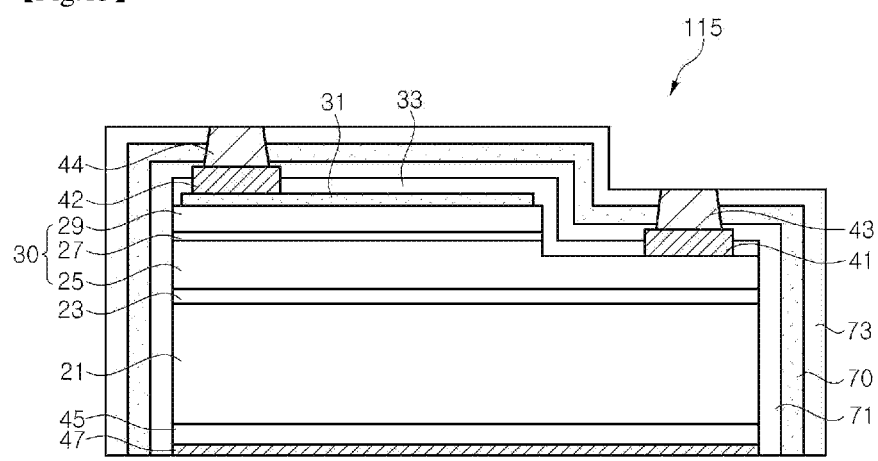

[Fig.16]
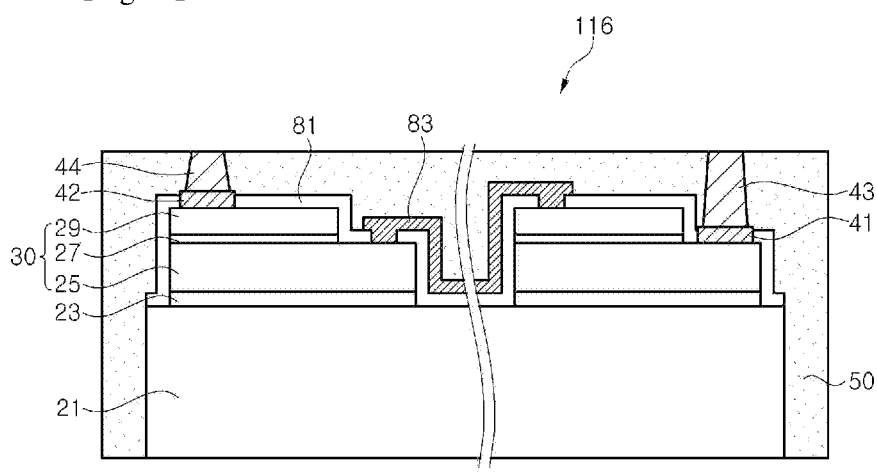
[Fig.17]
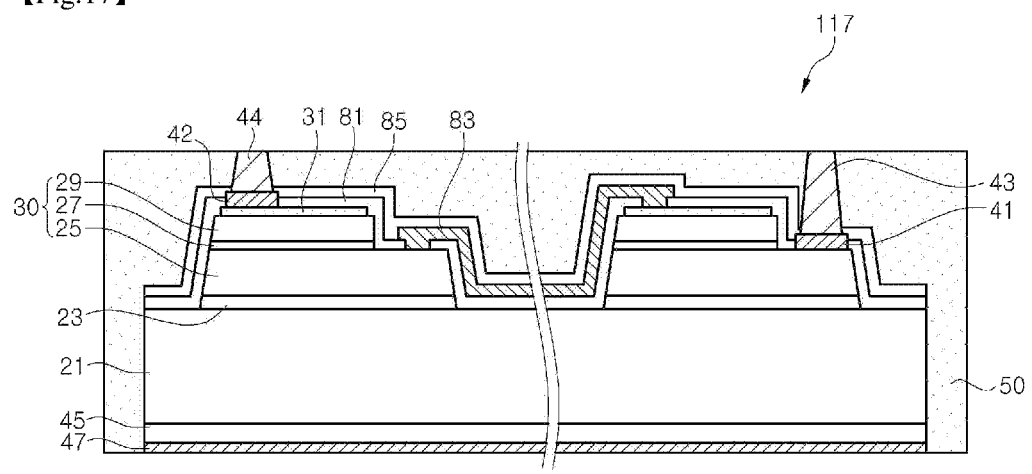

[Fig.18]
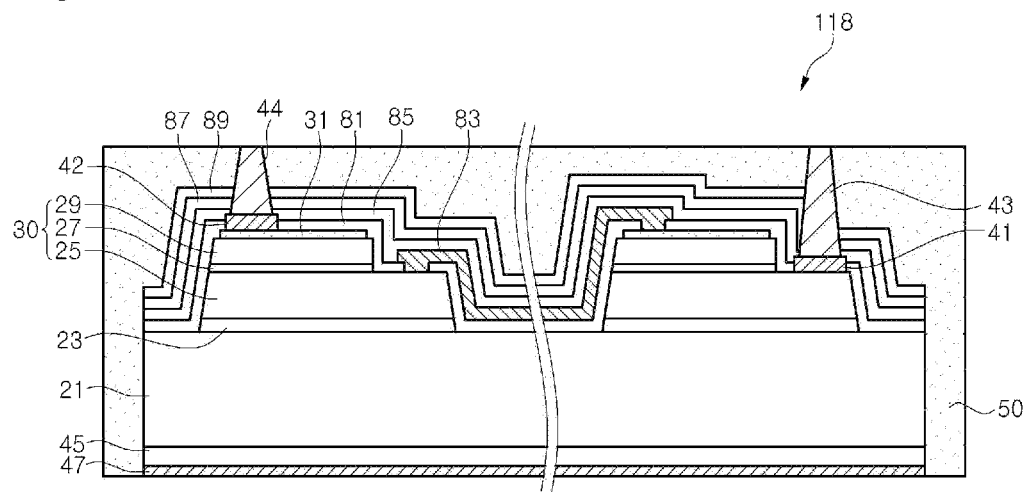
[Fig.19]
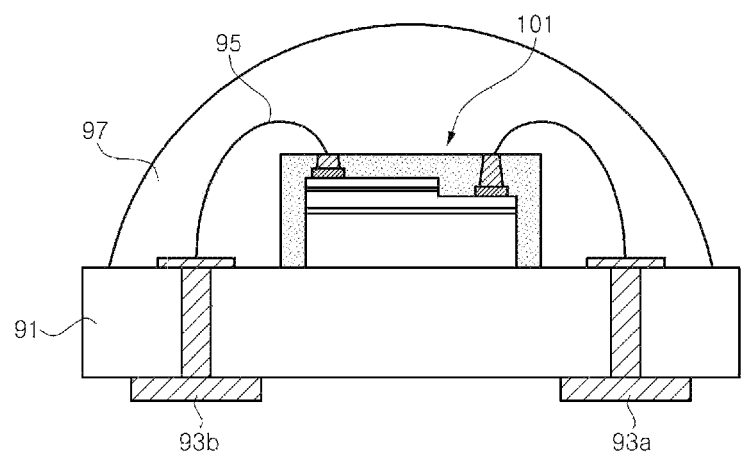

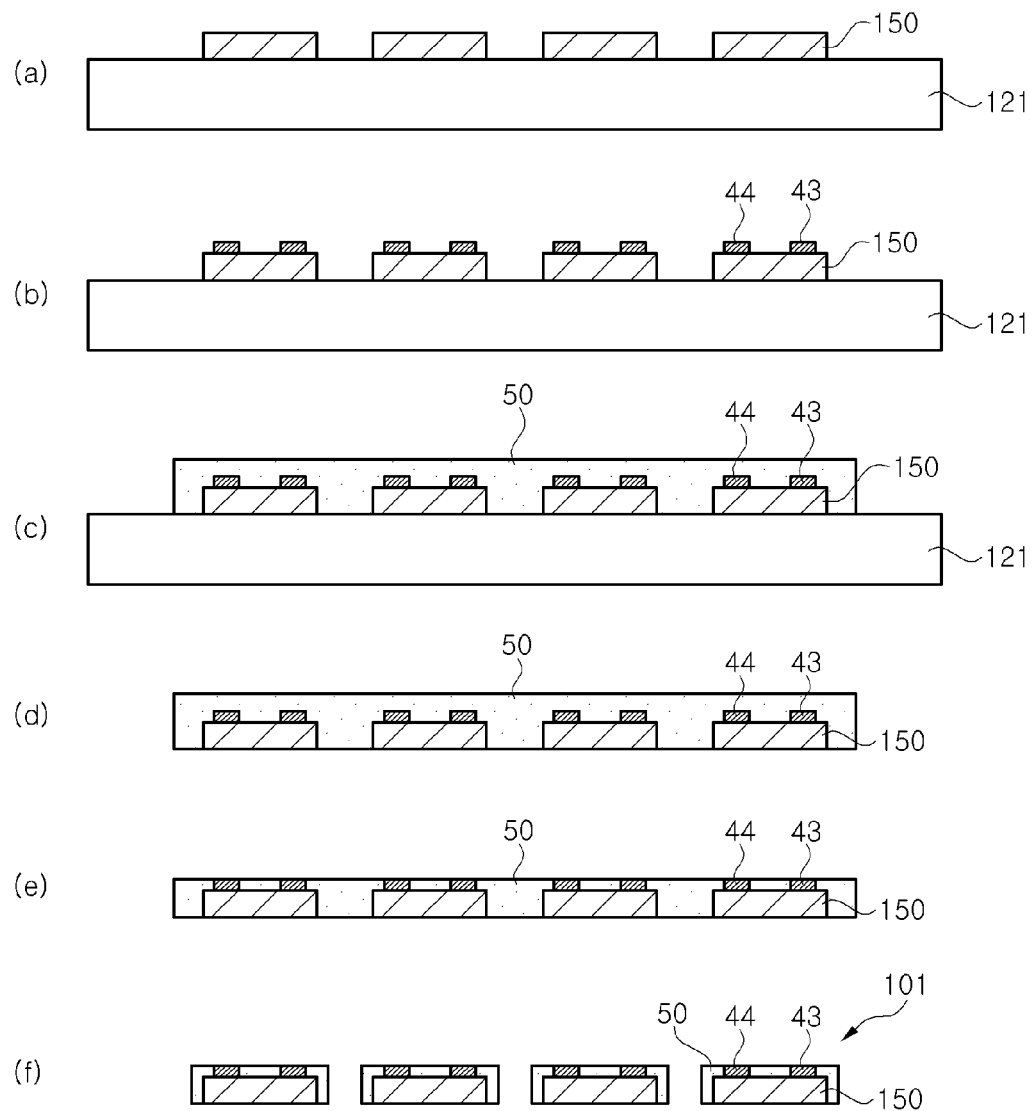
[Fig.20]

[Fig.21]
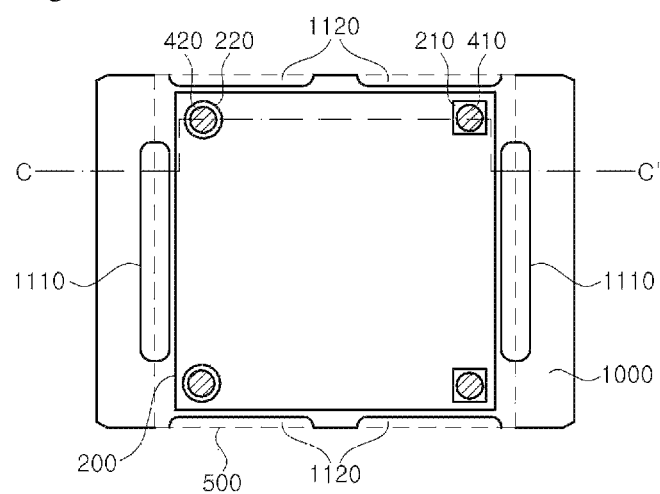
[Fig.22]
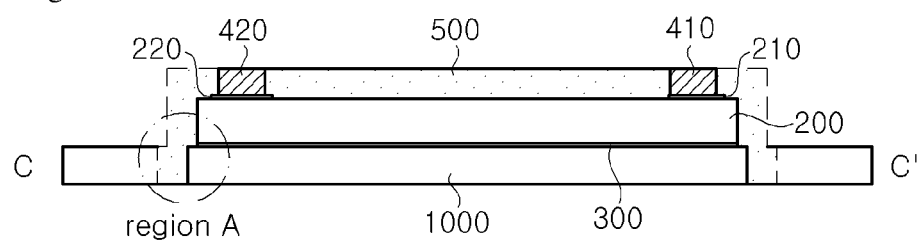

[Fig.23]
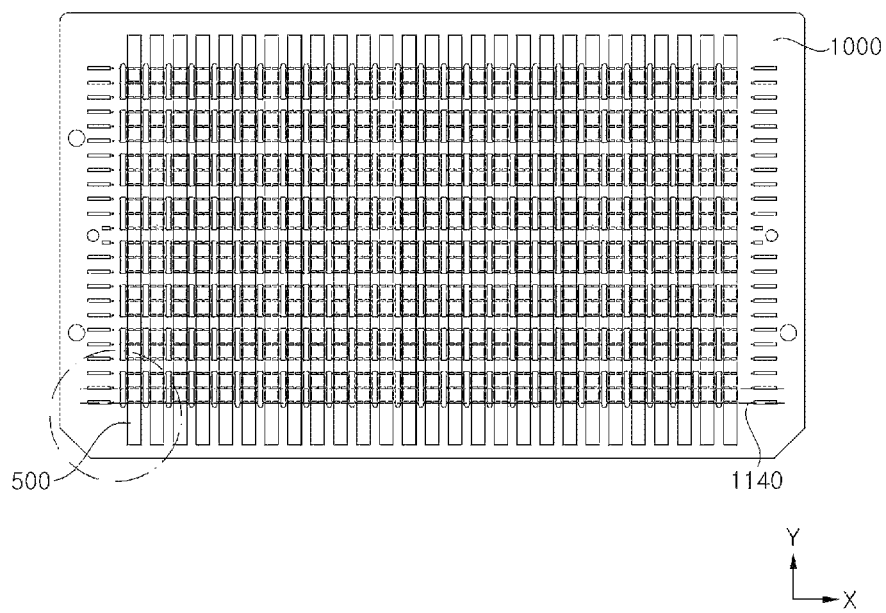
[Fig.24]
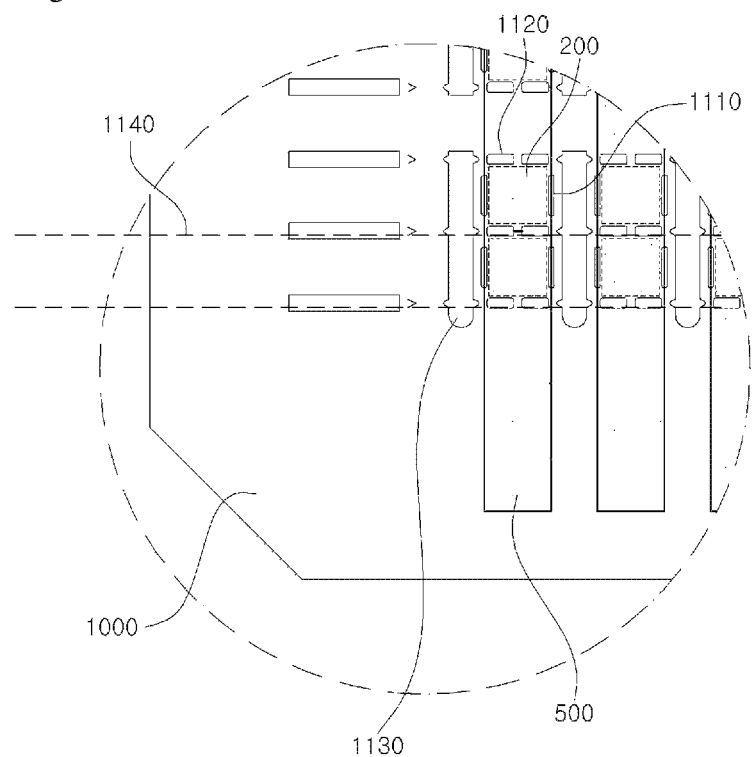

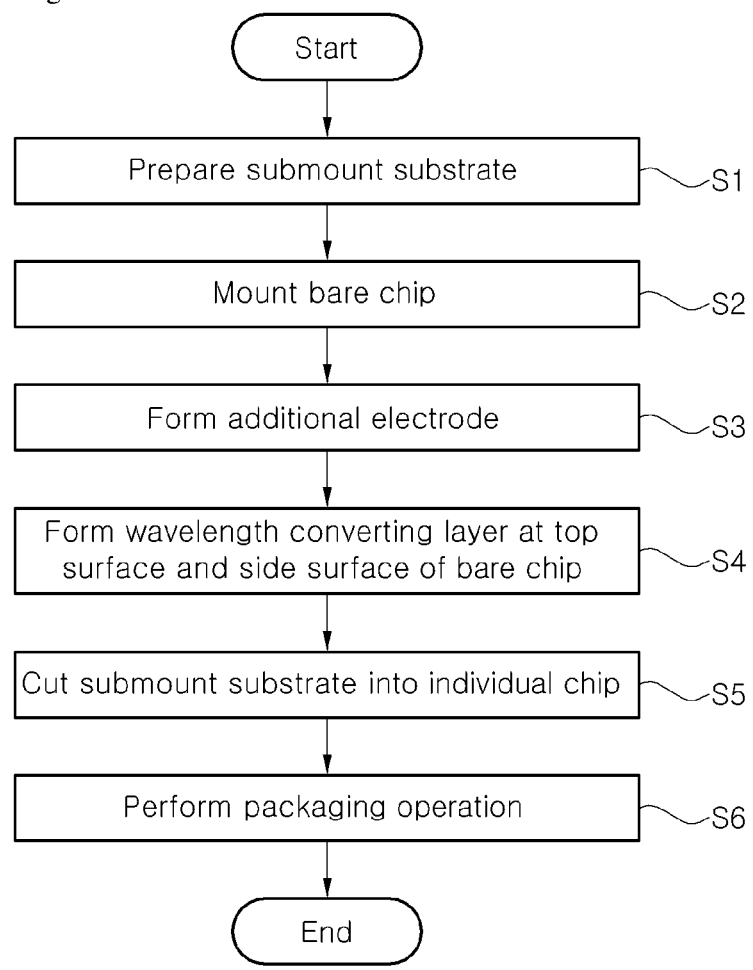
[Fig. 25]

[Fig. 26]
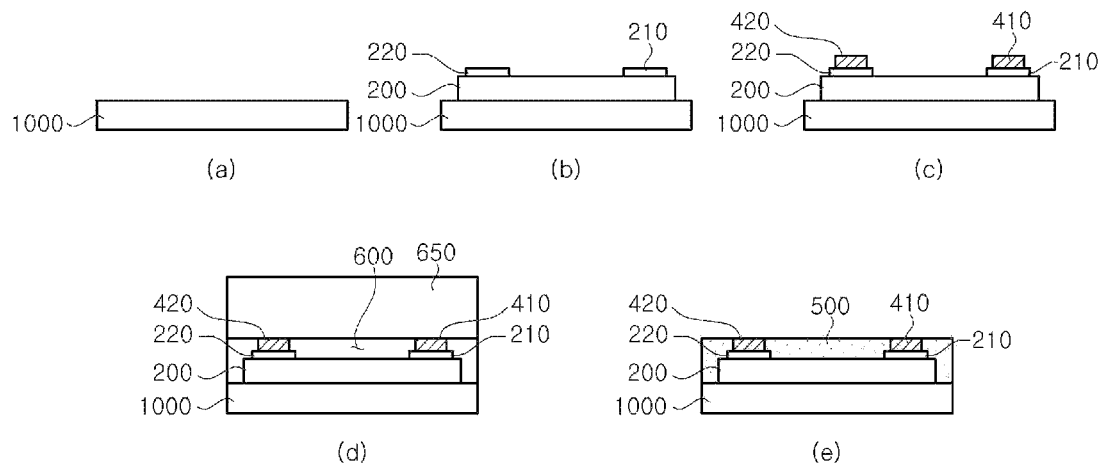
[Fig. 27]
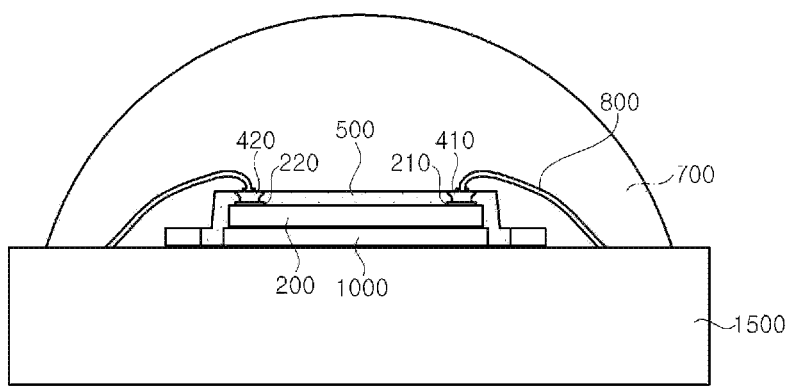
[Fig. 28]
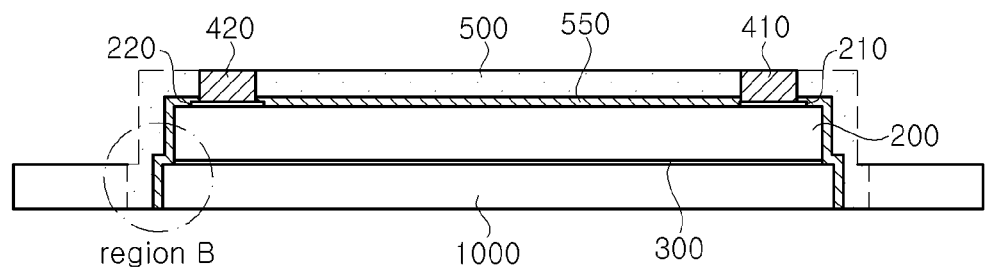

LIGHT EMITTING DIODE CHIP HAVING WAVELENGTH CONVERTING LAYER AND METHOD OF FABRICATING THE SAME, AND PACKAGE HAVING THE LIGHT EMITTING DIODE CHIP AND METHOD OF FABRICATING THE SAME

CROSS-REFERENCE TO RELATED APPLICATIONS

This application is a Continuation of U.S. patent application Ser. No. 14/173,287, filed on Feb. 5, 2014, which is a Continuation of U.S. patent application Ser. No. 13/071,666, filed on Mar. 25, 2011, now issued as U.S. Pat. No. 8,664,635, and claims priority from and the benefit of Korean Patent Application No. 10-2010-0046423, filed on May 18, 2010, Korean Patent Application No. 10-2010-0090352, filed on Sep. 15, 2010, Korean Patent Application No. 10-2010-0096682, filed on Oct. 5, 2010, and Korean Patent Application No. 10-2010-0110149, filed on Nov. 8, 2010, which are hereby incorporated by reference for all purposes as if fully set forth herein.

BACKGROUND OF THE INVENTION

Field of the Invention

The present invention relates to a light emitting diode (LED) chip and a method of fabricating the same, and a package having the LED chip and a method of fabricating the same, and more particularly, to an LED chip having a wavelength converting layer and a method of fabricating the same, and a package having the LED chip and a method of fabricating the same.

Discussion of the Background

LEDs are currently used as backlight sources in various types of display devices including cellular phones and the like. LEDs may be light, thin, and small, and may have energy-saving and long-lifespan characteristics. Since light emitting devices having LEDs mounted therein, i.e., LED packages, may implement white light with a high color rendering property, LED packages may be used for general illumination while substituting for white light sources such as fluorescent lamps.

Meanwhile, there are a variety of methods for implementing white light using LEDs, and a method may be used, in which white light is implemented through the combination of an InGaN LED to emit blue light of 430 nm to 470 nm and a phosphor to covert the blue light into light of a longer wavelength. For example, white light may be implemented through the combination of a blue LED and a yellow phosphor to be excited by the blue LED, the yellow phosphor to emit yellow light or through the combination of a blue LED, a green phosphor and a red phosphor.

A white light emitting device may be formed by applying a resin containing a phosphor in a recess region of a package having an LED mounted therein. However, as the resin is applied in the package, the phosphor may not be uniformly distributed in the resin, and it may be difficult to form the resin having a uniform thickness.

Accordingly, a method of attaching a wavelength converting sheet onto an LED has been researched. For example, the wavelength converting sheet may be formed by mixing a phosphor into glass or the like. The wavelength converting sheet may be attached on a top surface of the LED, so that white light can be implemented at a chip level.

However, since the wavelength converting sheet is attached on the top surface of the LED, it may be limited to implement white light in an LED in which light is configured to be mostly emitted through the top surface of the LED. Further, the wavelength conversion using the wavelength converting sheet may not be suitable in an LED in which a considerable amount of light is configured to be emitted through side surfaces of the LED, e.g., to side surfaces of a growth substrate.

Meanwhile, when a resin containing a phosphor is applied in a package, a wire may be bonded to an LED, and the resin is then applied thereto. Hence, it may not matter even if an electrode of the LED is covered with the resin containing the phosphor. However, when a wavelength converting layer is formed at the chip level, it may be necessary to bond the wire to the LED after the wavelength converting layer is formed.

SUMMARY OF THE INVENTION

Exemplary embodiments of the present invention provide a light emitting diode (LED) chip and a method of fabricating the same capable of performing light conversion such as wavelength conversion at a chip level.

Exemplary embodiments of the present invention also provide an LED chip and a method of fabricating the same capable of performing wavelength conversion with respect to light emitted through side surfaces of a substrate.

Exemplary embodiments of the present invention also provide an LED chip and a method of fabricating the same capable of performing light conversion such as wavelength conversion and performing wire bonding.

Exemplary embodiments of the present invention provide an LED chip capable of preventing light converted in a wavelength converting layer from being incident into the LED chip.

Exemplary embodiments of the present invention provide an LED chip capable of preventing a wavelength converting layer from being damaged by light.

Additional features of the invention will be set forth in the description which follows, and in part will be apparent from the description, or may be learned by practice of the invention.

According to an exemplary embodiment of the present invention, a light-emitting diode (LED) includes a substrate, a semiconductor stacked structure disposed on the substrate, the semiconductor stacked structure including a first conductivity-type semiconductor layer, an active layer, and a second conductivity-type semiconductor layer, a wavelength converting layer configured to convert a wavelength of light emitted from the semiconductor stacked structure, the wavelength converting layer covering side surfaces of the substrate and the semiconductor stacked structure, and a distributed Bragg reflector (DBR) configured to reflect at least a portion of light wavelength-converted by the wavelength converting layer, in which at least a portion of the DBR is covered with a metal layer configured to reflect light transmitted through the DBR.

According to an exemplary embodiment of the present invention, a light-emitting diode (LED) module includes a mount and an LED disposed on the mount. The LED includes a substrate, a semiconductor stacked structure disposed on the substrate, the semiconductor stacked structure including a first conductivity-type semiconductor layer, an active layer, and a second conductivity-type semiconductor layer, a wavelength converting layer configured to convert a wavelength of light emitted from the semiconductor stacked structure, the wavelength converting layer covering side surfaces of the substrate and the semiconductor stacked structure, and a distributed Bragg reflector (DBR) configured to reflect at least a portion of light wavelength-converted by the wavelength converting layer, in which at least a portion of the DBR is covered with a metal layer configured to reflect light transmitted through the DBR.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 1 is a sectional view illustrating a light emitting diode (LED) chip according to an exemplary embodiment of the present invention.

FIG. 2 is a sectional view illustrating an LED chip according to an exemplary embodiment of the present invention.

FIG. 3 is a sectional view illustrating an LED chip according to an exemplary embodiment of the present invention.

FIG. 4 is a sectional view illustrating an LED chip according to an exemplary embodiment of the present invention.

FIG. 5 is a sectional view illustrating an LED chip according to an exemplary embodiment of the present invention.

FIG. 6 is a sectional view illustrating an LED chip according to a an exemplary embodiment of the present invention.

FIG. 7 is a sectional view illustrating an LED chip according to an exemplary embodiment of the present invention.

FIG. 8 is a sectional view illustrating an LED chip according to an exemplary embodiment of the present invention.

FIG. 9 is a sectional view illustrating an LED chip according to an exemplary embodiment of the present invention.

FIG. 10 is a sectional view illustrating an LED chip according to an exemplary embodiment of the present invention.

FIG. 11 is a sectional view illustrating an LED chip according to an exemplary embodiment of the present invention.

FIG. 12 is a sectional view illustrating an LED chip according to an exemplary embodiment of the present invention.

FIG. 13 is a sectional view illustrating an LED chip according to an exemplary embodiment of the present invention.

FIG. 14 is a sectional view illustrating an LED chip according to an exemplary embodiment of the present invention.

FIG. 15 is a sectional view illustrating an LED chip according to an exemplary embodiment of the present invention.

FIG. 16 is a sectional view illustrating an LED chip according to an exemplary embodiment of the present invention.

FIG. 17 is a sectional view illustrating an LED chip according to an exemplary embodiment of the present invention.

FIG. 18 is a sectional view illustrating an LED chip according to an exemplary embodiment of the present invention.

FIG. 19 is a sectional view illustrating an LED package having an LED chip mounted therein according to an exemplary embodiment of the present invention.

FIG. 20 shows sectional views illustrating a method of fabricating an LED chip according to an exemplary embodiment of the present invention.

FIG. 21 is a top plan view illustrating an LED according to an exemplary embodiment of the present invention.

FIG. 22 is a sectional view of the LED taken along line C-C' of FIG. 21.

FIG. 23 is a view showing a submount substrate having a plurality of LEDs formed thereon according to an exemplary embodiment of the present invention.

FIG. 24 is an enlarged view of a region indicated by a circle in FIG. 23.

FIG. 25 is a flowchart illustrating a method of fabricating an LED package according to an exemplary embodiment of the present invention.

FIG. 26 shows sectional views sequentially illustrating processes of fabricating the LED package according to an exemplary embodiment of the present invention.

FIG. 27 is a sectional view illustrating the LED package having the LED mounted therein according to an exemplary embodiment of the present invention.

FIG. 28 is a sectional view illustrating an LED according to an exemplary embodiment of the present invention.

DETAILED DESCRIPTION OF THE ILLUSTRATED EMBODIMENTS

Hereinafter, exemplary embodiments of the present invention will be described in detail with reference to the accompanying drawings. The following exemplary embodiments are provided only for illustrative purposes so that those skilled in the art can fully understand the spirit of the present invention. Therefore, the present invention is not limited to the following exemplary embodiments but may be implemented in other forms. In the drawings, the widths, lengths, thicknesses and the like of elements may be exaggerated for convenience of illustration. Like reference numerals indicate like elements throughout the specification and drawings.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a sectional view illustrating a light emitting diode (LED) chip 101 according to an embodiment of the present invention.

The LED chip 101 includes a substrate 21; a GaN-based semiconductor stacked structure including a first conductive semiconductor layer 25, an active layer 27 and a second conductive semiconductor layer 29; a first electrode 41; a second electrode 42; a first additional electrode 43; a second additional electrode 44; and a transparent coating layer, e.g., a wavelength converting layer 50. A buffer layer 23 may be interposed between the first conductive semiconductor layer 25 and the substrate 21.

The substrate 21 has a top surface on which the semiconductor stacked structure is positioned, a bottom surface opposite to the top surface, and side surfaces to connect the top and bottom surfaces. The substrate 21 is not particularly limited as long as it is a transparent substrate. The substrate may be a substrate, e.g., a sapphire substrate, a silicon carbide substrate, a spinel substrate or a silicon substrate, on which a nitride semiconductor layers can be grown. The substrate 21 may be relatively thicker than the semiconductor stacked structure, and a portion of light generated in the semiconductor stacked structure may be emitted through the side surfaces of the substrate 21.

The active layer 27 and the first and second conductive semiconductor layers 25 and 29 may be made of a III-N-based compound semiconductor, e.g., an (Al, Ga, In)N semiconductor. Each of the first and second conductive semiconductor layers 25 and 29 may have a single- or multi-layered structure. For example, the first conductive semiconductor layer 25 and/or the second conductive semiconductor layer 29 may include a contact layer and a clad layer, and may further include a superlattice layer. In addition, the active layer 27 may have a single or multiple quantum well structure. For example, the first and second conductive semiconductor layers 25 and 29 may be n-type and p-type semiconductor layers, respectively, but the present invention is not limited thereto. That is, the first and second conductive semiconductor layers 25 and 29 may be p-type and n-type semiconductor layers, respectively. The buffer layer 23 relaxes lattice mismatch between the substrate 21 and the first conductive semiconductor layer 25, thereby reducing the defect density induced in the semiconductor layers 27 and 29.

Meanwhile, the first electrode 41 is electrically connected to the first conductive semiconductor layer 25 by coming in contact with an exposed surface of the first conductive semiconductor layer 25. The second electrode 42 is positioned on top of the second conductive semiconductor layer 29 and electrically connected to the second conductive semiconductor layer 29. For example, the first and second electrodes 41 and 42 may include Ti, Cu, Ni, Al, Au or Cr, and may be made of two or more materials thereof. A transparent conductive layer (not shown) such as Ni/Au, ITO, IZO or ZnO may be formed on the second conductive semiconductor layer 29 in order to disperse the current, and the second electrode 42 may come in contact with the transparent conductive layer.

The first and second additional electrodes 43 and 44 are positioned on the first and second electrodes 41 and 42, respectively. The first and second additional electrodes 43 and 44 are narrower than the first and second electrodes 41 and 42, respectively. That is, the widths of first and second additional electrodes 43 and 44 are limited to the widths of upper portions of the first and second electrodes 41 and 42, respectively. That is, the first and second additional electrodes 43 and 44 may be as wide as, but not wider than, the first and second electrodes 41 and 42, respectively. The first and second additional electrodes 43 and 44 may have shapes that become narrower as they extend away from the first and second electrodes 41 and 42, respectively. Through such shapes, the first and second additional electrodes 43 and 44 may be stably attached to the respective first and second electrodes 41 and 42, which may improve a subsequent process such as a wire bonding process. The ratio of height to bottom surface area in each of the first and second additional electrodes 43 and 44 may be limited within a predetermined range so that the first and second additional electrodes 43 and 44 can be stably maintained on the first and second electrodes 41 and 42, respectively.

The wavelength converting layer 50 may be formed with a phosphor contained in epoxy or silicon, or may be formed using only a phosphor. For example, the wavelength converting layer 50 may be formed by disposing a phosphor in epoxy or silicon and then applying the epoxy or silicon with the phosphor contained therein. In this case, a mold may be used so that the wavelength converting layer 50 with a uniform thickness is formed on the side surfaces of the substrate 21. The wavelength converting layer 50 may be formed by disposing the mold so that the whole top surface or a portion of the top surface of each of the first and second additional electrodes 43 and 44 is exposed. Alternatively, the top surface of each of the first and second additional electrodes 43 and 44 may be exposed by applying a resin containing a phosphor to cover each of the first and second additional electrodes 43 and 44 and then mechanically polishing the resin. Accordingly, the wavelength converting layer 50 having a flat top surface is formed, and the first and second additional electrodes 43 and 44 are exposed to the outside of the LED chip 101 by passing through the wavelength converting layer 50. Alternatively, the first and second additional electrodes 43 and 44 may not pass completely through the wavelength converting layer 50, and contact holes may be formed to allow electrical connection with the first and second additional electrodes 43 and 44. Another alternative is that wires may connect to the first and second additional electrodes 43 and 44, respectively, and the wavelength converting layer 50 may be formed around the wires, and the wires are exposed to the outside of the LED chip 101.

Furthermore, the wavelength converting layer 50 may have a refractive index ranging, e.g., from 1.4 to 2.0, and $TiO_2$, $SiO_2$ or $Y_2O_3$ may be incorporated into the wavelength converting layer 50 so as to control the refractive index. These materials may be in powder form, for example.

Meanwhile, as shown in the figure, the top surface of the first additional electrode 43 may be positioned at the same height as the top surface of the second additional electrode 44. Thus, when the first conductive semiconductor layer 25 is exposed by removing a portion of the second conductive semiconductor layer 29 and the active layer 27, the first additional electrode 43 may be longer than the second additional electrode 44 as shown in this figure.

The wavelength converting layer 50 may cover the side surfaces of the substrate 21 and the upper portion of the semiconductor stacked structure 30. Thus, it is possible to form the LED chip 101 capable of performing wavelength conversion not only with respect to light emitted through the top surface of the semiconductor stacked structure 30 but also with respect to light emitted though the side surfaces of the substrate 21. That is, wavelength conversion may be performed with respect to light emitted out of the top surface and the side surfaces of the LED chip 101.

FIG. 2 is a sectional view illustrating an LED chip 102 according to an exemplary embodiment of the present invention.

Referring to FIG. 2, the LED chip 102 according to this exemplary embodiment is almost similar to the LED chip 101 of FIG. 1, but is different in that the LED 102 further includes a spacer layer 33, a lower distributed Bragg reflector (DBR) 45 and a metal layer 47. A transparent conductive layer 31 is interposed between the spacer layer 33 and the second conductive semiconductor layer 29 of the semiconductor stacked structure 30. The second electrode 42 may be connected to the transparent conductive layer 31. In this exemplary embodiment, detailed descriptions of components identical to those of the LED chip 101 of the aforementioned exemplary embodiment will be omitted to avoid redundancy.

The spacer layer 33 may cover the upper portion of the semiconductor stacked structure 30 and the transparent conductive layer 31. The wavelength converting layer 50 is spaced apart from the semiconductor stacked structure 30 by the spacer layer 33. The spacer layer 33 may be made of, for example, silicon nitride or silicon oxide. The spacer layer 33 may be implemented as a DBR formed by alternately stacking insulating layers with different refractive indices, e.g., $SiO_2/TiO_2$ or $SiO_2/Nb_2O_5$. In this case, the optical thicknesses of the insulating layers with the different refractive indices may be controlled, so that the spacer layer 33 can transmit light generated in the active layer 27 and reflect light incident from the outside or converted in the wavelength converting layer 50. The DBR has a reflection band in which the DBR reflects light in a long-wavelength region of the visible light region and transmits short-wavelength visible light or ultraviolet light generated in the active layer 27. Particularly, since the optical absorptance of the $Nb_2O_5$ is relatively lower than that of the $TiO_2$, the DBR may be formed using $SiO_2/Nb_2O_5$ so as to prevent light loss.

Meanwhile, the lower DBR 45 is positioned on the bottom of the substrate 21. The lower DBR 45 is formed by alternately stacking insulating layers with different refractive indices, and has a relatively high reflexibility, preferably a reflexibility of 90% or higher, not only with respect to light in a blue wavelength region, e.g., light generated in the active layer 27 but also with respect to light in a yellow wavelength region or light in a green wavelength region and/or a red wavelength region. Further, the lower DBR 45 may entirely have a reflexibility of 90% or higher throughout the wavelength region ranging, e.g., from 400 nm to 700 nm.

The lower DBR 45 having a relatively high reflexibility throughout a wide wavelength region is formed by controlling the respective optical thicknesses of the material layers repeatedly stacked therein. For example, the lower DBR 45 may be formed by alternately stacking a first layer of $SiO_2$ and a second layer $TiO_2$ or by alternately stacking a first layer of $SiO_2$ and a second layer of $Nb_2O_5$. Since the optical absorptance of the $Nb_2O_5$ is relatively lower than that of the $TiO_2$, it may be alternately stacked so that there is a first layer of $SiO_2$ and a second layer of $Nb_2O_5$. As the stacking number of the first and second layers increases, the reflexibility of the lower DBR 45 is more stable. For example, the total stacking number of the first and second layers in the lower DBR 45 may be 50 or more, i.e., 25 or more pairs of first and second layers may be stacked.

All the first or second layers alternately stacked in the lower DBR 45 do not necessarily have the same thickness, but the thickness of each of the first and second layers may be selected in order to have a relatively high reflexibility not only with respect to the wavelength of light generated in the active layer 27 but also with respect to another wavelength in the visible light region. Alternatively, the lower DBR 45 may be formed by stacking a plurality of DBRs each having a high reflexibility with respect to a specific wavelength band.

The lower DBR 45 is employed, so that when light converted in the wavelength converting layer 50 is again incident toward the substrate 21, the incident light can be again reflected to be emitted to the outside, thereby improving light emission efficiency.

Meanwhile, the first and last layers in the lower DBR 45 may be made of $SiO_2$. The $SiO_2$ is disposed as the first and last layers in the lower DBR 45, so that the lower DBR 45 can be stably attached to the substrate 21. Further, the lower DBR 45 can be protected using a last layer formed of $SiO_2$.

The metal layer 47 is positioned on the bottom of the lower DBR 45. The metal layer 47 may be made of a reflective metal such as aluminum so as to reflect light transmitted through the lower DBR 45, or may be made of another metal. Moreover, the metal layer 47 may help heat generated in the semiconductor stacked structure 30 to be dissipated to the outside, thereby enhancing the heat dissipation performance of the LED chip 102.

According to this exemplary embodiment, the spacer layer 33 is formed with a DBR having a high reflexibility with respect to the long-wavelength visible light, so that it is possible to prevent light converted in the wavelength converting layer 50 from being again incident into the semiconductor stacked structure 30. Further, the lower DBR 45 is employed, so that when light from the outside is incident toward the substrate 21 or when light converted in the wavelength converting layer 50 is incident toward the substrate 21, the incident light can be reflected, thereby improving the light emission efficiency.

FIG. 3 is a sectional view illustrating an LED chip 103 according to an exemplary embodiment of the present invention.

Referring to FIG. 3, the LED chip 103 is similar to the LED chip 102 described with reference to FIG. 2, also includes a stress relaxation layer 35 and an upper DBR 37 interposed between the wavelength converting layer 50 and the semiconductor stacked structure, in addition to the spacer layer 33 or in place of the spacer layer 33. That is, the stress relaxation layer 35 may be positioned above the semiconductor stacked structure 30, e.g., on the spacer layer 33, and the upper DBR 37 is positioned on the stress relaxation layer 35. The stress relaxation layer 35 and the upper DBR 37 also serve as spacer layers.

The upper DBR 37 may be formed by alternately stacking insulating layers with different refractive indices, e.g., $SiO_2/TiO_2$ or $SiO_2/Nb_2O_5$. In this case, the optical thicknesses of the insulating layers with the different refractive indices are controlled, so that the upper DBR 37 can transmit light generated in the active layer 27 and reflect light incident from the outside or converted in the wavelength converting layer 50. The upper DBR 37 has a reflection band in which it reflects light in a long-wavelength region of the visible light region and transmits short-wavelength visible light or ultraviolet light generated in the active layer 27. Particularly, since the optical absorptance of the $Nb_2O_5$ is relatively lower than that of the $TiO_2$, the DBR may be formed using the $SiO_2/Nb_2O_5$ so as to prevent light loss.

Meanwhile, the stress relaxation layer 35 may be made of a spin on glass (SOG) or a porous silicon oxide film. The stress relaxation layer 35 allows the stress of the upper DBR 37 to be reduced to prevent the detachment of the upper DBR 37 from the LED chip 101.

When the upper DBR 37 is formed by alternately stacking insulating layers with different refractive indices, e.g., $SiO_2/TiO_2$ or $SiO_2/Nb_2O_5$, relatively high-density layers are stacked, and hence the stress in the upper DBR may be increased. Therefore, the upper DBR is easily detached from the layer below it, e.g., the spacer layer 33. Accordingly, if the stress relaxation layer 35 is disposed under the upper DBR 37, it is possible to prevent the detachment of the upper DBR 37.

Meanwhile, in this exemplary embodiment, the spacer layer 33 may be made of a single layer, e.g., of silicon nitride or silicon oxide, or may be omitted.

FIG. 4 is a sectional view illustrating an LED chip 104 according to an exemplary embodiment of the present invention.

Referring to FIG. 4, although the horizontal type LED chips 101, 102 and 103 have been described as examples in FIG. 1, FIG. 2, and FIG. 3, the LED chip 104 shown in FIG. 4 is a vertical type LED chip. The LED chip 104 includes a substrate 51; a semiconductor stacked structure 30 including a first conductive semiconductor layer 25, an active layer 27 and a second conductive semiconductor layer 29; an upper electrode 41; an additional electrode 43; and a wavelength converting layer 60. The wavelength converting layer 60 may be spaced apart from the semiconductor stacked structure 30 by a spacer layer. For example, the spacer layer may include a spacer layer 33 as described with reference to FIG. 2, or may include a spacer layer 33, a stress relaxation layer 35 and/or an upper DBR 37 as described with reference to FIG. 3. Further, the LED chip 104 may include a reflection metal layer 55, a barrier metal layer 57 and a bonding metal 53.

The substrate 51 is distinguished from a growth substrate for growing the semiconductor layers 25, 27 and 29, and is a secondary substrate attached to the previously grown compound semiconductor layers 25, 27 and 29. Although the substrate 51 may be a conductive substrate, e.g., a metal substrate or semiconductor substrate, the present invention is not limited thereto. That is, the support substrate may be an insulating substrate, e.g., sapphire.

The semiconductor stacked structure 30 is positioned on the substrate 51, and includes the first conductive semiconductor layer 25, the active layer 27 and the second conductive semiconductor layer 29. Here, in the semiconductor stacked structure 30, the p-type compound semiconductor layer, i.e., the second conductive semiconductor layer 29 is positioned closer to the substrate 51 than the n-type compound semiconductor layer, i.e., the first conductive semiconductor layer 25. The semiconductor stacked structure 30 may be positioned on a partial region of the substrate 51. That is, the substrate 51 may have a relatively wider area than the semiconductor stacked structure 30, and the semiconductor stacked structure 30 may be positioned within the region surrounded by the edge of the substrate 51.

Since the first conductive semiconductor layer 25, the active layer 27 and the second conductive semiconductor layer 25 are similar to the semiconductor layers described with reference to FIG. 1, their detailed descriptions will be omitted. Meanwhile, the n-type compound semiconductor layer 25 having a relatively small resistance is positioned at the opposite side of the substrate 51 so that the top surface of the n-type compound semiconductor layer 25 may be configured to be coarse.

The reflection metal layer 55 may be interposed between the substrate 51 and the semiconductor stacked structure 30, and the barrier metal layer 57 may be interposed between the substrate 51 and the reflection metal layer 55 so as to surround the reflection metal layer 55. The substrate 51 and the barrier metal layer 57 may completely surround the reflection metal layer 55, as shown in FIG. 4. Further, the substrate 51 may be bonded to the semiconductor stacked structure 30 through the bonding metal 53. The reflection metal layer 55 and the barrier metal layer 57 may serve as a lower electrode electrically connected to the second conductive semiconductor layer 29.

Meanwhile, the wavelength converting layer 60 is positioned above the semiconductor stacked structure 30. Although the wavelength converting layer 60 may be positioned above the semiconductor stacked structure 30, the wavelength converting layer may also cover side surfaces of the semiconductor stacked structure 30. Further, the wavelength converting layer 60 may cover side surfaces of the substrate 51.

The spacer layer 33 covers the top surface of the semiconductor stacked structure 30, and the stress relaxation layer 35 and the upper DBR 37 may be sequentially positioned on the spacer layer 33. Since the spacer layer 33, the stress relaxation layer 35 and the upper DBR 37 may be made of the same materials as described with reference to FIG. 3, their detailed descriptions will be omitted to avoid redundancy. The spacer layer 33 may also be omitted. The spacer layer 33 may be a DBR as described with reference to the exemplary embodiment shown in FIG. 2. In this case, the stress relaxation layer 35 and the upper DBR 37 may be omitted.

Meanwhile, the upper electrode 41 is positioned on the semiconductor stacked structure 30, e.g., the first conductive semiconductor layer 25 and electrically connected to the first conductive semiconductor layer 25. The additional electrode 43 is positioned on the upper electrode 41. The additional electrode 43 may have the same shape and structure as the first or second additional electrode 43 or 44 described with reference to FIG. 1. The additional electrode 43 is exposed to the outside through the wavelength converting layer 60.

FIG. 5 is a sectional view illustrating an LED chip 105 according to an exemplary embodiment of the present invention.

Referring to FIG. 5, the LED chip 105 is similar to the LED chip 101 described with reference to FIG. 1, but is different in that the wavelength converting layer 50 is spaced apart from the semiconductor stacked structure 30. That is, a spacer layer 61 is interposed between the wavelength converting layer 50 and the semiconductor stacked layer 30.

As the wavelength converting layer 50 is spaced apart from the semiconductor stacked structure 30, it is possible to prevent the resin or phosphor in the wavelength converting layer 50 from being deteriorated by light generated in the active layer 27. The spacer layer 61 may also be interposed between the side surfaces of the substrate 21 and the wavelength converting layer 50.

The spacer layer 61 may be made of a transparent resin, a silicon nitride film or a silicon oxide film. In order to reduce heat transferred to the phosphor, the thermal conductivity of the spacer layer 61 may be relatively low. For example, the spacer layer 61 may have a thermal conductivity less than 3 W/mK. When the spacer layer 61 is made of a transparent resin, $TiO_2$, $SiO_2$ or $Y_2O_3$ may be incorporated into the transparent resin so as to control the refractive index of the transparent resin. $TiO_2$, $SiO_2$ or $Y_2O_3$ may be in powder form, for example. Further, the spacer layer 61 may be formed into a single- or multi-layered structure. The refractive index and thickness of a plurality of layers that constitute the spacer layer 61 is controlled, so that the spacer layer 61 can be configured to transmit light generated in the active layer 27 and to reflect light converted in the wavelength converting layer 50 and then incident into the LED chip 105. For example, a DBR to transmit light generated in the active layer or reflect light converted in the wavelength converting layer 50 may be selectively formed by repeatedly stacking layers with different refractive indices, e.g., $TiO_2$ and SiO$_2$. Further, when the spacer layer 61 includes a DBR, a stress relaxation layer 62 may be interposed between the semiconductor stacked structure 30 and the DBR so as to prevent the release of the DBR, like the exemplary embodiment of the LED chip 106 shown in FIG. 6.

FIG. 7 is a sectional view illustrating an LED chip 107 according to an exemplary embodiment of the present invention.

Referring to FIG. 7, the LED chip 107 is almost identical to the LED chip 105 described with reference to FIG. 5, but is different in that it further includes a spacer layer 33, a lower DBR 45 and a metal layer 47. A transparent conductive layer 31 is interposed between the spacer layer 33 and the second conductive semiconductor layer 29 of the semiconductor stacked structure 30. The second electrode 42 may be connected to the transparent conductive layer 31. The spacer layer 61 covers the spacer layer 33 so that the wavelength converting layer 50 is further spaced apart from the semiconductor stacked structure 30. When the spacer layer 61 is a DBR, the stress relaxation layer 62 as shown in FIG. 6 may be interposed between the spacer layer 61 and the semiconductor stacked structure 30 so as to prevent the release of the spacer layer 61.

Since the spacer layer 33, the lower DBR 45 and the metal layer 47 are identical to those described with reference to FIG. 2, their detailed descriptions will be omitted to avoid redundancy. As described with reference to FIG. 3, the upper DBR 37 and the stress relaxation layer 35 may be positioned above the semiconductor stacked structure 30, and thus, the wavelength converting layer 50 can be further spaced apart from the semiconductor stacked structure 30.

FIG. 8 is a sectional view illustrating an LED chip 108 according to an exemplary embodiment of the present invention.

Referring to FIG. 8, the LED chip 108 is almost identical to the LED chip 105 described with reference to FIG. 5, but is different in that a transparent resin 63 is additionally formed on the wavelength converting layer 50. That is, the transparent resin 63 covers the wavelength converting layer 50. The transparent resin 63 protects the phosphor from external moisture. In order to prevent moisture absorption, the transparent resin 63 may have a relatively high hardness, e.g., a durometer Shore hardness of 60A or greater. When the spacer layer 61 is made of a transparent resin, the high-hardness transparent resin 63 may have a higher hardness than the transparent resin of the spacer layer 61.

In order to control the refractive index of the high-hardness transparent resin 63, TiO$_2$, SiO$_2$ or Y$_2$O$_3$ may be incorporated into the high-hardness transparent resin 63. TiO$_2$, SiO$_2$ or Y$_2$O$_3$ may be in powder form.

FIG. 9 is a sectional view illustrating an LED chip 109 according to a still further embodiment of the present invention.

Referring to FIG. 9, the LED chip 109 is almost identical to the LED chip 108 described with reference to FIG. 8, but is different in that it further includes a spacer layer 33, a lower DBR 45 and a metal layer 47. A transparent conductive layer 31 is interposed between the spacer layer 33 and the second conductive semiconductor layer 29 of the semiconductor stacked structure 30. The second electrode 42 may be connected to the transparent conductive layer 31. The spacer layer 61 covers the spacer layer 33 so that the wavelength converting layer 50 is further spaced apart from the semiconductor stacked structure 30.

Since the spacer layer 33, the lower DBR 45 and the metal layer 47 are identical to those described with reference to FIG. 2, their detailed descriptions will be omitted to avoid redundancy. As described with reference to FIG. 3, the upper DBR 37 and the stress relaxation layer 35 may be positioned above the semiconductor stacked structure 30, and thus, the wavelength converting layer 50 can be further spaced apart from the semiconductor stacked structure 30.

FIG. 10 is a sectional view illustrating an LED chip 110 according to an exemplary embodiment of the present invention.

Referring to FIG. 10, the LED chip 110 is similar to the LED chip 101 described with reference to FIG. 1, but is different in that the top surface of the first additional electrode 43 is positioned lower than that of the second additional electrode 44.

Accordingly, the top surface of a wavelength converting layer 70 has a stepped shape in the vicinity of the first additional electrode 43. The wavelength converting layer 70 having such a stepped shape may be formed using a mold specially manufactured along the surface shape of the semiconductor stacked structure.

FIG. 11 is a sectional view illustrating an LED chip 111 according to an exemplary embodiment of the present invention.

Referring to FIG. 11, the LED chip 111 is similar to the LED chip 110 described with reference to FIG. 10, but is different in that it further includes a spacer layer 33, a lower DBR 45 and a metal layer 47. A transparent conductive layer 31 is interposed between the spacer layer 33 and the second conductive semiconductor layer 29 of the semiconductor stacked structure 30. The second electrode 42 may be connected to the transparent conductive layer 31.

Since the spacer layer 33, the lower DBR 45 and the metal layer 47 are identical to those described with reference to FIG. 2, their detailed descriptions will be omitted to avoid redundancy. As described with reference to FIG. 3, the stress relaxation layer 35 and the upper DBR 37 may be interposed between the wavelength converting layer 70 and the semiconductor stacked structure 30.

FIG. 12 is a sectional view illustrating an LED chip 112 according to an exemplary embodiment of the present invention.

Referring to FIG. 12, the LED chip 112 is similar to the LED chip 110 described with reference to FIG. 10, but is different in that the wavelength converting layer 70 is spaced apart from the semiconductor stacked structure 30. That is, a spacer layer 71 is interposed between the wavelength converting layer 70 and the semiconductor stacked structure as described with reference to FIG. 5. As the wavelength converting layer 70 is spaced apart from the semiconductor stacked structure, it is possible to prevent the resin or phosphor in the wavelength converting layer 70 from being deteriorated by light generated in the active layer 27. The spacer layer 71 may also be interposed between the side surfaces of the substrate 21 and the wavelength converting layer 70.

When the spacer layer 71 includes a DBR, the stress relaxation layer 62 described with reference to FIG. 6 may be interposed between the spacer layer 71 and the semiconductor stacked structure 30.

FIG. 13 is a sectional view illustrating an LED chip 113 according to an exemplary embodiment of the present invention.

Referring to FIG. 13, the LED chip 113 is similar to the LED chip 112 described with reference to FIG. 12, but is different in that it further includes a spacer layer 33, a lower DBR 45 and a metal layer 47. A transparent conductive layer 31 is interposed between the spacer layer 33 and the second conductive semiconductor layer 29 of the semiconductor stacked structure 30. The second electrode 42 may be connected to the transparent conductive layer 31. The spacer layer 71 covers the spacer layer 33 so that the wavelength converting layer 70 is further spaced apart from the semiconductor stacked structure 30.

Since the spacer layer 33, the lower DBR 45 and the metal layer 47 are identical to those described with reference to FIG. 2, their detailed descriptions will be omitted to avoid redundancy. As described with reference to FIG. 3, the upper DBR 37 and the stress relaxation layer 35 may be positioned above the semiconductor stacked structure 30, and thus, the wavelength converting layer 70 can be further spaced apart from the semiconductor stacked structure 30.

FIG. 14 is a sectional view illustrating an LED chip 114 according to an exemplary embodiment of the present invention.

Referring to FIG. 14, the LED chip 114 is similar to the LED 112 described with reference to FIG. 12, but is different in that a transparent resin 73 is additionally formed on the wavelength converting layer 70. That is, the transparent resin 73 covers the wavelength converting layer 70. The transparent resin 73 protects the phosphor from external moisture. In order to prevent moisture absorption, the transparent resin 73 may have a relatively high hardness, e.g., a durometer Shore hardness of 60A or greater. When the spacer layer 71 is made of a transparent resin, the high-hardness transparent resin 73 may have a higher hardness than the transparent resin of the spacer layer 71.

In order to control the refractive index of the high-hardness transparent resin 73, $TiO_2$, $SiO_2$ or $Y_2O_3$ may be incorporated into the high-hardness transparent resin 73.

FIG. 15 is a sectional view illustrating an LED chip 115 according to an exemplary embodiment of the present invention.

Referring to FIG. 15, the LED chip 115 is similar to the LED chip 114 described with reference to FIG. 14, but is different in that it further includes a spacer layer 33, a lower DBR 45 and a metal layer 47. A transparent conductive layer 31 is interposed between the spacer layer 33 and the second conductive semiconductor layer 29 of the semiconductor stacked structure 30. The second electrode 42 may be connected to the transparent conductive layer 31. The spacer layer 71 covers the spacer layer 33 so that the wavelength converting layer 70 is further spaced apart from the semiconductor stacked structure 30.

Since the spacer layer 33, the lower DBR 45 and the metal layer 47 are identical to those described with reference to FIG. 2, their detailed descriptions will be omitted to avoid redundancy. As described with reference to FIG. 3, the upper DBR 37 and the stress relaxation layer 35 may be positioned above the semiconductor stacked structure 30, and thus, the wavelength converting layer 70 can be further spaced apart from the semiconductor stacked structure 30.

FIG. 16 is a sectional view illustrating an LED chip 116 according to an exemplary embodiment of the present invention.

Referring to FIG. 16, the LED chip 116 is almost similar to the LED chip 101 described with reference to FIG. 1, but is different in that a plurality of semiconductor stacked structures 30 are positioned on the substrate 21. The plurality of semiconductor stacked structures may be electrically connected to one another by wires 83. Each of the wires 83 connects a first conductive semiconductor layer 25 of one of the semiconductor stacked structures 30 to a second conductive semiconductor layer 29 of another of the semiconductor stacked structures 30 adjacent to said one of the semiconductor stacked structures 30, thereby forming a serial array. Such serial arrays may be connected in parallel or in reverse parallel.

Meanwhile, an insulating layer 81 may be interposed between the semiconductor stacked structures and the wire 83 so as to prevent the first and second conductive semiconductor layers 25 and 29 of the semiconductor stacked structures from being short-circuited by the wire 83. The insulating layer 81 also serves as a spacer layer to allow the semiconductor stacked structures 30 and the wavelength converting layer 50 to be spaced apart from each other.

Meanwhile, the first and second electrodes 41 and 42 may be positioned on different semiconductor stacked structures 30, respectively. In this exemplary embodiment, the positions on which the first and second electrodes 41 and 42 are formed are not particularly limited. For example, the first and second electrodes 41 and 42 may all be formed on the substrate 21, or may all be formed on the first or second conductive semiconductor layers 25 or 29. In this case, the first and second electrodes 41 and 42 may be connected to different semiconductor stacked structure 30 through the wire 83, respectively. The first and second additional electrodes 43 and 44 are disposed on the first and second electrodes 41 and 42, respectively.

The wavelength converting layer 50 covers the plurality of semiconductor stacked structures 30. The wavelength converting layer 50 may also cover the side surfaces of the substrate 21. As described with reference to FIG. 5, the wavelength converting layer 50 may be spaced apart from the semiconductor stacked structure by the spacer layer 61.

FIG. 17 is a sectional view illustrating an LED chip 117 according to an exemplary embodiment of the present invention.

Referring to FIG. 17, the LED chip 117 is similar to the LED chip 116 described with reference to FIG. 16, but is different in that it further includes a second insulating layer 85, a lower DBR 45 and a metal layer 47. The side surfaces of each of the semiconductor stacked structures 30 are configured to be inclined so that the wires 83 may be easily formed. A transparent conductive layer 31 is positioned between the insulating layer 81 and each of the semiconductor stacked structures 30. The transparent conductive layer 31 is in ohmic contact with the second conductive semiconductor layer 29. Each of the wires 83 connects a first conductive semiconductor layer 25 of one of the semiconductor stacked structures 30 to a second conductive semiconductor layer 29 of another of the semiconductor stacked structures 30 adjacent to said one of the semiconductor stacked structures 30, thereby forming a serial array. Such serial arrays may be connected in parallel or in reverse parallel.

Meanwhile, the insulating layer 81 may cover the transparent conductive layer 31, and may further cover the side surfaces of the semiconductor stacked structures 30. The second insulating layer 85 may cover the semiconductor stacked structures 30 and the wires 83 so as to protect the semiconductor stacked structures 30 and the wires 83, and the second insulating layer 85 covers the insulating layer 81. Each of the first and second insulating layers 81 and 85 may be formed of a layer made of the same material, e.g., a silicon oxide film or a silicon nitride film, and may be formed into a single-layered structure. In this case, the second insulating layer 85 may be relatively thinner than the insulating layer so as to prevent the second insulating layer 85 from being released from the insulating layer 81.

Alternatively, the insulating layer 81 and/or the second insulating layer 85 may be implemented with a DBR formed by alternately stacking insulating layers with different refractive indices, like the spacer layer 33 described with reference to FIG. 2. As described in FIG. 2, the DBR is configured to transmit light generated in the active layer 27 and to reflect light converted in the wavelength converting layer 50. The second insulating layer 85 may be formed with a DBR, while the insulating layer 81 may be formed with a stress relaxation layer such as an SOG or a porous silicon oxide film.

The wavelength converting layer 50 is positioned on the second insulating layer 85, and the insulating layer 81 and the second insulating layer 85 serve as spacer layers. In addition, the spacer layer 61 as described with reference to FIG. 5 may be interposed between the plurality of semiconductor stacked structures 30 and the wavelength converting layer 50. As described with reference to FIG. 8, the high-hardness transparent resin 63 may cover the wavelength converting layer 50.

FIG. 18 is a sectional view illustrating an LED chip 118 according to an exemplary embodiment of the present invention.

Referring to FIG. 18, the LED chip 118 is similar to the LED chip 117 described with reference to FIG. 17, but is different in that it further includes a stress relaxation layer 87 and an upper DBR 89.

That is, the upper DBR 89 may be positioned between the plurality of semiconductor stacked structures 30 and the wavelength converting layer 50. In addition, the stress relaxation layer 87 may be positioned between the upper DBR 89 and the plurality of semiconductor stacked structures 30. The upper DBR 89 may be formed by alternately stacking insulating layers with different refractive indices, like the upper DBR 37 described with reference to FIG. 3. The stress relaxation layer 87 may be formed with an SOG or a porous silicon oxide film, like the stress relaxation layer 35 of FIG. 3. The upper DBR 89 and the stress relaxation layer 87 also serve as spacer layers to allow the wavelength converting layer 50 to be spaced apart from the semiconductor stacked structure 30.

In this exemplary embodiment, each of the insulating layer 81 and the second insulating layer 85 may be formed into a single-layered structure, and the second insulating layer 85 may be omitted.

In the aforementioned exemplary embodiments, the phosphor may be a yttrium aluminum garnet (YAG)- or terbium aluminum garnet (TAG)-based phosphor, a silicate-based phosphor or a nitride- or oxynitride-based phosphor. Although the wavelength converting layer 50, 60 or 70 may contain the same kind of phosphor, the present invention is not limited thereto. That is, the wavelength converting layer may contain two or more kinds of phosphors. Although it has been illustrated and described that the wavelength converting layer 50, 60 or 70 is a single layer, a plurality of wavelength converting layers may be used, and different phosphors may be contained in the plurality of wavelength converting layers, respectively.

FIG. 19 is a sectional view illustrating an LED package having the LED chip 101 mounted therein according to an exemplary embodiment of the present invention.

Referring to FIG. 19, the LED package includes the LED chip 101, a mount 91 for mounting the LED chip 101 thereon. The LED package further includes bonding wires 95 and a lens 97.

The mount 91 may be, for example, a printed circuit board, a lead frame, a ceramic substrate or the like, and includes lead terminals 93a and 93b. The first and second additional electrodes (43 and 44 in FIG. 1, respectively) of the LED chip 101 are electrically connected to the lead terminals 93a and 93b through the bonding wires 95, respectively.

Meanwhile, the lens 97 covers the LED chip 101. The lens 97 adjusts a directional angle of the light emitted from the LED chip 101 so that the light is emitted in a desired direction. Since the wavelength converting layer 50 is formed in the LED chip 101, the lens 97 does not necessarily contain a phosphor.

Although the LED package with the built-in LED chip 101 mounted therein has been described in the present exemplary embodiment, any of the LED chips 101 to 117 as described with reference to FIGS. 2 to 17 may be mounted in the LED package.

Hereinafter, a method of fabricating an LED chip according to exemplary embodiments of the present invention will be described in detail.

FIG. 20 shows sectional views illustrating a method of fabricating the LED chip 101 according to an exemplary embodiment of the present invention.

Referring to FIG. 20 (a), bare chips 150 are arranged on a support substrate 121. The bare chips 150 may be arranged at an equal interval on the support substrate 121. As described in FIG. 1, each of the bare chips 150 includes a substrate 21; a semiconductor stacked structure 30 including a first conductive semiconductor layer 25, an active layer 27 and a second conductive semiconductor layer 29; a first electrode 41; and a second electrode 42. A buffer layer 23 may be interposed between the first conductive semiconductor layer 25 and the substrate 21. That is, each bare chip 150 corresponds to a portion of the LED chip 101 shown in FIG. 1 in which the first and second additional electrodes 43 and 44 and the wavelength converting layer 50 are excluded, and detailed descriptions of the respective components in each bare chip 150 will be omitted to avoid redundancy.

The support substrate 121 supports the bare chips 150 so that the bare chips 150 maintain an equal interval therebetween. The support substrate 121 may be, for example, a substrate made of glass, ceramic, sapphire, GaN, Si or the like.

Referring to FIG. 20 (b), first and second additional electrodes 43 and 44 are formed in each of the bare chips 150. For example, the first and second additional electrodes 43 and 44 may be formed using chemical vapor deposition (CVD), sputtering, plating, solder ball or the like. The first and second additional electrodes 43 and 44 may be made of a material with electric conductivity, such as Au, Ag, Cu, W, Ni or Al, or alloys thereof. Accordingly, the first and second additional electrodes 43 and 44 as described with reference to FIG. 1 may be formed on each of the bare chips 150.

Referring to FIG. 20 (c), a wavelength converting layer 50 for covering the bare chips 150 and the first and second additional electrodes 43 and 44 is formed on the support substrate 50. The wavelength converting layer 50 may contain a phosphor, and may further contain $TiO_2$, $SiO_2$ or $Y_2O_3$ so as to control its refractive index. The wavelength converting layer 50 is configured to be thick enough to cover the first and second additional electrodes 43 and 44. The wavelength converting layer 50 may be formed using various application methods including injection molding, transfer molding, compression molding, printing and the like.

Referring to FIG. 20 (d), the support substrate 121 is removed after the wavelength converting layer 50 is formed. A release film (not shown) may be formed on the support substrate 121 so that the support substrate 121 is easily removed. The release film may be a kind of film which may be released by, for example, heat or light such as ultraviolet light. Thus, the support substrate 121 can be easily removed by applying heat to the release film or irradiating light such as ultraviolet light onto the release film.

After the support substrate 121 is removed, the bare chips 150 are fixed to one another by the wavelength converting layer 50, and may be attached on a separate support body.

Referring to FIG. 20 (*e*), the first and second additional electrodes 43 and 44 are exposed by removing an upper portion of the wavelength converting layer 50. The upper portion of the wavelength converting layer 50 may be removed by a physical method using grinding, cutting or laser, or may be removed by a chemical method using etching or the like. Further, the upper portion of the wavelength converting layer 50 may be removed so that the top surfaces the first and second additional electrodes 43 and 44 are flush with the wavelength converting layer 50.

Referring to FIG. 20 (*f*), individual LED chips 101 shown in FIG. 1 are completed by sawing the wavelength converting layer 50 filled in spaces between the bare chips 150. The wavelength converting layer 50 may be sawed using blade or laser. Each of the individual LED chips 101 exposes the first and second additional electrodes 43 and 44, and has the wavelength converting layer 50 for covering the side surfaces of the substrate 21 and the top surface of the semiconductor stacked structure.

Although it has been described in the present exemplary embodiment that the first and second additional electrodes 43 and 44 are formed on the support substrate 121, the present invention is not limited thereto. That is, the first and second additional electrodes 43 and 44 may be formed on each of the bare chips before the bare chips are arranged on the support substrate 121.

The spacer layer (61 in FIG. 5) may be first formed on the bare chips 150 arranged on the support substrate 121 before the first and second additional electrodes 43 and 44 are formed. Further, the stress relaxation layer (62 in FIG. 6) may be formed before the spacer layer is formed. Subsequently, the first and second electrodes 41 and 42 are exposed by pattering the spacer layer, and the first and second additional electrodes 43 and 44 may be formed on the first and second electrodes 41 and 42, respectively.

Although it has been described in the present exemplary embodiment that the support substrate 121 is removed before the upper portion of the wavelength converting layer 50 is removed, the support substrate 121 may be removed after the upper portion of the wavelength converting layer 50 is removed or after the wavelength converting layer 50 is sawed using blade, laser or the like.

Meanwhile, each of the bare chips 150 may include a spacer layer 33, a lower DBR 45 and a metal layer 47 as described with reference to FIG. 2, and may further include an upper DBR 37 and a stress relaxation layer 35 as described with reference to FIG. 3. Although each bare chip 150 may include a single semiconductor stacked structure 30 as described with reference to FIG. 1, the present invention is not limited thereto. That is, each bare chip 150 may include a plurality of semiconductor stacked structures 30 as described with reference to FIG. 16, FIG. 17, and FIG. 18, and may further include an insulating layer 81, a second insulating layer 85, a stress relaxation layer 87 and a DBR 89. As such, the LED chips 116 to 118 as shown in FIG. 16, FIG. 17, and FIG. 18 can be fabricated.

Although it has been described in the present exemplary embodiment that the LED chip with the wavelength converting layer 50 formed on each bare chip 150 is fabricated, various transparent coating layers for changing optical characteristics as well as the wavelength converting layer 50 may be formed on each bare chip 150 using a method similar to the method of forming the wavelength converting layer 50 according to this embodiment. The transparent coating layers may contain various materials for improving optical characteristics, e.g., a diffusion material.

Hereinafter, an LED according to an exemplary embodiment of the present invention will be described with reference to FIG. 21 and FIG. 22.

FIG. 21 is a top plan view illustrating an LED according to an exemplary embodiment of the present invention. FIG. 22 is a sectional view of the LED taken along line C-C' of FIG. 21.

Referring to FIG. 21 and FIG. 22, the LED according to the present exemplary embodiment may include a submount substrate 1000; a bare chip 200; an adhesive member 300; first and second electrodes 210 and 220 formed on an upper portion of the bare chip 200; first and second additional electrodes 410 and 420; and a wavelength converting layer 500.

Here, the submount substrate 1000 is used to mount and move the bare chip 200, and is distinguished from a growth substrate for growing a semiconductor stacked structure of the bare chip 200, which will be described later. An electrode (not shown) may be formed or may not be formed on the submount substrate 1000. Although the submount substrate 1000 may be, for example, a printed circuit board, a lead frame or a ceramic substrate, the present invention is not limited thereto. The submount substrate 1000 has a top surface, a bottom surface and side surfaces to connect the top and bottom surfaces to each other. First slits 1110 and second slits 1120 may be formed along the circumference of a region of the submount substrate 1000 on which the bare chip 200 is mounted.

The first and second slits 1110 and 1120 are formed in the submount substrate 1000 before the bare chip 200 is mounted on the submount substrate 1000, in consideration of the position at which the bare chip 200 is to be mounted on the submount substrate 1000 and the size of the bare chip 200. As such, the first and second slits 1110 and 1120 allow the interval between the first and second slits 1110 and 1120 and the bare chip 200 to be constantly maintained. Accordingly, when the bare chip 200 is mounted on the submount substrate 1000 using, for example, a metal bonding method as will be described later, the drift of the melted metal may be limited by the slits 1110 and 1120. As a result, the bare chip 200 may not be misaligned, and may be disposed at its correct position.

Although the first and second slits 1110 and 1120 may be formed, for example, in the shape of an opening which passes through the submount substrate 1000, the present invention is not limited thereto. That is, according to exemplary embodiments, the first and second slits 1110 and 1120 may be formed in the shape of a concave pattern formed using, e.g., an etching scheme.

When the first and second slits 1110 and 1120 are formed in the shape of an opening, the wavelength converting layer 500 passes through the openings of the first slits 1110 so that the wavelength converting layer 500 is formed not only on the top surface of the submount substrate 1000 but also on inner side surfaces of the submount substrate 1000 as indicated in region A of FIG. 22. As such, the submount substrate 1000 and the bare chip 200 may be fixed to each other by the wavelength converting layer 500.

The shapes of the openings of the first and second slits 1110 and 1120 may be identical to or different from each other. Although the openings of the first and second slits 1110 and 1120 may be formed in a shape similar to a rectangle with rounded corners, the present invention is not limited thereto. That is, the openings of the first and second slits 1110 and 1120 may be formed in a shape extended along side surfaces of the bare chip 200. Meanwhile, FIG. 21 shows the state in which the submount substrate 1000 is cut for each chip when the second slit 1120 is formed to be overlapped with a dicing line 1140 (see FIG. 24), and therefore, only the half shapes of the second slits 1120 have been shown, unlike the first slits 1110. When the position of the dicing line 1140 is controlled, the second slits 1120 may be formed similar to the first slits 1110. The adhesive member 300 serves to attach the bare chip 200 to the top surface of the submount substrate 1000. Although when the bare chip 200 has, for example, a horizontal type structure, a bottom surface of the growth substrate (not shown) on which a semiconductor layer of the bare chip 200 is formed and a top surface of the submount substrate 1000 may be attached to each other through the adhesive member 300, the present invention is not limited thereto. The adhesive member 300 may be prepared using silicon paste, metal paste, epoxy paste or the like. However, the present invention is not limited to the specific kind of adhesive member. That is, the bare chip 200 may be mounted on the submount substrate 1000 through metal bonding using a metal such as AuSn.

Although the bare chip 200 as described above is not illustrated for the sake of simplicity, the bare chip 200 may be an LED chip in which a GaN-based semiconductor stacked structure including a first conductive semiconductor layer, an active layer and a second conductive semiconductor layer is formed. Specifically, the semiconductor stacked structure may include, for example, n-type and p-type layers made of a GaN film and an active layer made of an InGaN film. The semiconductor stacked structure is generally grown on a growth substrate (not shown), and the growth substrate may be formed using a sapphire ($Al_2O_3$) substrate, a silicon carbide (SiC) substrate, a silicon (Si) substrate, a zinc oxide (ZnO) substrate, a gallium arsenide (GaAs) substrate, a gallium phosphide (GaP) substrate, or the like. When the bare chip 200 has a vertical type structure, the growth substrate may be separated from the semiconductor stacked structure through, e.g., a laser lift-off (LLO) process.

The present invention is not limited to a specific structure of the bare chip, such as a horizontal or vertical type structure, but the following description will be directed mainly to the horizontal type bare chip. Since the structure of the bare chip 200 is identical to that of a general GaN-based LED, its detailed description will be omitted.

The first electrode 210 and the second electrode 220 are electrically connected to the first and second conductive semiconductor layers (not shown) of the bare chip 200, respectively. For example, each of the first and second electrodes may include Ti, Cu, Ni, Al, Au or Cr, and may be made of an alloy of these. The first and second electrodes 210 and 220 may be configured to have a thickness of about 10 μm to 200 μm. Although FIG. 21 shows that the number of each of the first and second electrodes 210 and 220 formed on the top surface of the bare chip is two, the number or position of each of the first and second electrodes 210 and 220 is not limited to any specific embodiment illustrated herein. That is, according to the kind of the bare chip 200, all the first and second electrodes 210 and 220 may be formed on the top surface of the bare chip 200 when the bare chip 200 has a horizontal type structure. Alternatively, any one of the first and second electrodes 210 and 220 may be omitted when the bare chip 200 has a vertical type structure. When all the first and second electrodes 210 and 220 are formed on the top surface of the bare chip, only one first electrode 210 and one second electrode 220 may be formed opposite to each other on the top surface of the bare chip 200, unlike that shown in FIG. 21. That is, as the area of the bare chip 200 itself becomes large, the number of each of the first and second electrodes 210 and 220 formed on top of the bare chip may be two as shown in FIG. 21. However, in a general case, the number of the first and second electrodes 210 and 220 formed on top of the bare chip may be one, and the position of each of the first and second electrodes 210 and 220 may be changed depending on the horizontal or vertical type structure. The following description will be directed mainly to the structure of FIG. 22.

The first additional electrode 410 and the second additional electrode 420 may be formed on the respective first and second electrodes 210 and 220 with a thickness of at least 100 μm, for example, using a conductive metallic material such as Au, Cu, Ag or Al. The first and second additional electrodes 410 and 420 may be formed by a fabrication method using chemical vapor deposition (CVD), e-beam, sputtering, plating, solder ball, or the like. Depending on embodiments, the first and second additional electrodes 410 and 420 may be formed by applying a photosensitive material and then exposing and developing the applied photosensitive material, and therefore, the present invention is not limited to the specific forming method of the first and second additional electrodes 410 and 420.

The first and second additional electrodes 410 and 420 may be narrower than the first and second electrodes 210 and 220, respectively. That is, the first and second additional electrodes 410 and 420 are limited to the top portions of the first and second electrodes 210 and 220, respectively. The first addition electrode 410 and the second additional electrode 420 may have shapes in which their widths are narrow as they extend from the first and second electrodes 210 and 220, respectively. Through such shapes, the first and second additional electrodes 410 and 420 can be stably attached to the respective first and second electrodes 210 and 220, which may be advantageous in a subsequent process such as a wire bonding process. The ratio of height to bottom surface area in each of the first and second additional electrodes 410 and 420 may be limited within a predetermined range so that the first and second additional electrodes 410 and 420 can be stably maintained on the first and second electrodes 210 and 220, respectively.

The wavelength converting layer 500 is formed by containing a phosphor in epoxy or silicon or by using only a phosphor. The wavelength converting layer 500 uses light generated in the active layer (not shown) of the bare chip 200 as an excitation source to convert the wavelength of the light, and then serves to emit the converted light with the wavelength converted.

Here, the kind of the phosphor is not particularly limited, and all materials for wavelength conversion, known in the art, may be used. For example, the phosphor may include at least one selected from the group consisting of (Ba, Sr, Ca)$_2$SiO$_4$:Eu$^{2+}$, YAG ((Y, Gd)$_3$(Al, Ga)$_5$O$_{12}$:Ce$^{3+}$) based phosphor, TAG((Tb, Gd)$_3$(Al, Ga)$_5$O$_{12}$:Ce$^{3+}$) based phosphor, (Ba, Sr, Ca)$_3$SiO$_5$:Eu$^{2+}$, (Ba, Sr, Ca)MgSi$_2$O$_6$:Eu$^{2+}$, Mn$^{2+}$, (Ba, Sr, Ca)$_3$MgSi$_2$O$_8$:Eu$^{2+}$, Mn$^{2+}$, and (Ba, Sr, Ca)MgSiO$_4$:Eu$^{2+}$, Mn$^{2+}$. However, the present invention is not limited thereto.

According to the present exemplary embodiment, the wavelength converting layer 500 may be configured to have a uniform thickness not only on the top surface (region indicated by dotted line in FIG. 21) of the bare chip 200 but also on the side surfaces of the bare chip 200. As will be described later, the wavelength converting layer 500 with a flat top surface may be formed in a region except the top surfaces (whole or portion) of the first and second additional electrodes 410 and 420 by using a mold. The first and second electrodes 410 and 420 are exposed to the outside of the LED by passing through the wavelength converting layer 500, so that wire bonding can be easily performed in a packaging operation. Although the wavelength converting layer 500 is formed at a chip level, it is unnecessary to perform an additional process of exposing electrodes for the purpose of wire bonding.

Further, the wavelength converting layer 500 may have a refractive index, e.g., ranging from 1.4 to 2.0, and $TiO_2$, $SiO_2$ or $Y_2O_3$ may be incorporated into the wavelength converting layer 500 so as to control the refractive index.

Meanwhile, as shown in FIG. 22, the top surface of the first additional electrode 410 may be positioned to be flush with that of the second additional electrode 420. Thus, when the first conductive semiconductor layer is exposed by removing portions of the second conductive semiconductor layer and the active layer in the bare chip 200 as a horizontal type LED, the first additional electrode 410 electrically connected to the first conductive semiconductor layer may be configured to be longer than the second additional electrode 420 electrically connected to the second conductive semiconductor layer.

According to the present exemplary embodiment, since the wavelength converting layer 500 covers not only the top surface of the bare chip 200 but also the side surfaces of the bare chip 200, the LED can perform wavelength conversion not only with respect to light emitted through the top surface of the semiconductor stacked structure, as described in the exemplary embodiments above, but also with respect to light emitted through the side surfaces of the semiconductor stacked structure.

FIG. 23 is a view showing a submount having a plurality of LEDs formed thereon according to an exemplary embodiment of the present invention. FIG. 24 is an enlarged view of a region indicated by a circle in FIG. 23.

According to the present exemplary embodiment, a plurality of bare chips 200 are mounted in a matrix form on one submount substrate 1000, and the wavelength converting layer 500 is formed on top surfaces of the plurality of bare chips 200 using a mold. Then, the submount substrate is diced into individual chips. If the second slits 1120 are formed to be overlapped with the dicing line 1140, such a dicing process can be easily performed.

Meanwhile, slits 1130 for chip separation may be further formed in the submount substrate 1000 according to an exemplary embodiment of the present invention, in addition to the aforementioned first and second slits 1110 and 1120. That is, if the submount substrate 1000 is cut in a lateral direction (X-direction) along the dicing lines 1140, LEDs may be separated as individual chips by the slits 1130 for chip separation which are formed on the submount substrate 1000 at a predetermined interval in a longitudinal direction (Y-direction).

Thus, according to the present exemplary embodiment, a plurality of light emitting devices can be simultaneously fabricated by mounting a plurality of bare chips on one substrate, forming a wavelength converting layer on top surfaces of all the bare chips through the same process, and then cutting the substrate into individual chips. Thus, it is possible to decrease fabrication time and to reduce fabrication cost through mass production.

Hereinafter, an LED and a method of fabricating a package having the same will be described in detail with reference to FIGS. 25 and 26.

FIG. 25 is a flowchart illustrating a method of fabricating an LED package according to an exemplary embodiment of the present invention. FIG. 26 shows sectional views sequentially illustrating processes of fabricating the LED package according to the embodiment of the present invention. The processes of FIG. 25 may be performed at the same time or at different times. If necessary, the order of the processes may be changed, and a specific process may be omitted. Therefore, the present invention is not limited to the order shown in these figures.

First, as shown in FIG. 26 (a), a submount substrate 1000 is provided (S1). As described above, a plurality of first and second slits 1110 and 1120 may be formed in the submount substrate 1000 along the circumference of a region of the submount substrate 1000 on which a bare chip 200 is to be mounted (see FIG. 24). Slits 1130 for chip separation may be previously formed so that even if the submount substrate 1000 is cut only in the X-direction in a subsequent dicing process, LEDs may be separated as individual chips.

Subsequently, as shown in FIG. 26 (b), a plurality of bare chips 200 are mounted in a matrix form on the submount substrate 1000 (S2). Here, the bare chip 200 may be attached to a top surface of the submount substrate 1000 by using an adhesive member 300, or by using a metal bonding method using, e.g., AuSn or the like. In mounting the bare chips 200, the bare chips 200 are not misaligned due to the first and second slits 1110 and 1120 but may be arranged at desired positions. At this time, first and second electrodes 210 and 220 respectively electrically connected to first and second conductive semiconductor layers (not shown) may be formed on the top surface of the bare chip 200.

Subsequently, as shown in FIG. 26 (c), first and second additional electrodes 410 and 420 are formed on top of the first and second electrode 210 and 220, respectively (S3). The first and second additional electrodes 410 and 420 may be formed, for example, using a conductive metallic material such as Au, Cu, Ag or Al. The first and second additional electrodes 410 and 420 may be formed by a fabrication method using CVD, e-beam, sputtering, plating, solder balls or the like. Depending on embodiments, the first and second additional electrodes may be formed by applying a photosensitive material and then exposing and developing the applied photosensitive material.

Subsequently, a wavelength converting layer 500 is formed on the top surface and side surfaces of each of the bare chips 200 (S4). According to the present exemplary embodiment, as shown in FIG. 26 (d), while the submount substrate 1000 with the bare chips 200 mounted thereon is clamped with the mold 650 so that the top surfaces of the first and second additional electrodes 410 and 420 are pressured and one surface of a mold 650 are closely adhered to the top surfaces of the first and second additional electrodes 410 and 420, thereby preventing a space from being generated, a mixture of phosphor and resin is injected into a mold internal space 600 and then the resin is cured to form the wavelength converting layer 500 (FIG. 26 (e)). At this time, the shapes of the additional electrodes 410 and 420 are changed due to the force of the mold 650 to pressurize the additional electrodes 410 and 420, so that the heights of the additional electrodes can be identical to each other by the mold even though their heights are formed to be slightly different from each other. Further, the gap between the mold and the additional electrodes 410 and 420 cannot be produced.

Depending on embodiments, the height of the mold may be controlled not only to be identical to the entire height of the bare chip 2000 but also to be lower than the entire height of the bare chip 200 having the additional electrodes 410 and 420. In FIG. 26 (*e*), only the single bare chip 200 has been illustrated as a reference. However, practically, the wavelength converting layer 500 may be simultaneously formed on the top surfaces of the plurality of bare chips by using a single mold with respect to the whole of the plurality of bare chips 200 arranged in a matrix form in FIG. 23 and FIG. 24.

Subsequently, the submount substrate 1000 having the wavelength converting layer 500 formed thereon is cut along the dicing lines 1140, thereby separating LEDs as individual chips (S5). Since openings of the slits 1130 for chip separation are extended long in a Y-axis direction in regions between chips, it is sufficient to perform a cutting operation only in an X-axis direction. Thus, the dicing process can be simplified, and processing time can be reduced.

Subsequently, as shown in FIG. 27, after each of the LEDs is mounted on a substrate 1500 for packaging, bonding wires 800 are electrically connected to the respective first and second additional electrodes 410 and 420 so that electric power can be applied to the LED, and a lens 700 to encapsulate the LED is formed so as to protect the LED from the outside (S6).

That is, FIG. 27 is a sectional view illustrating the LED package having the LED mounted therein according to the present exemplary embodiment. Referring to FIG. 27, the LED package may include a substrate 1500 for packaging to which the submount substrate 1000 having the bare chip 200 mounted thereon is attached, bonding wires 800 electrically connected to the respective first and second additional electrodes 410 and 420 formed on the bare chip 200, and a lens 700 for encapsulating the bare chip 200.

Unlike the submount substrate 1000, the substrate 1500 for packaging is a substrate provided to supply electric power to the bare chip 200, and may be, for example, a printed circuit board, a lead frame, a ceramic substrate or the like. However, the present invention is not limited thereto. The substrate for packaging may include lead terminals for power supply (not shown). Thus, the first and second additional electrodes 410 and 420 may be electrically connected to the lead terminals through the bonding wires 800, respectively.

Meanwhile, the lens 700 is configured to encapsulate the submount substrate 1000 having the wavelength converting layer 500 formed thereon, i.e., for covering the entire bare chip 200, so that light generated in the bare chip 200 can be emitted in a desired direction by adjusting the directional angle of the light. According to this embodiment, since the wavelength converting layer 500 is formed on the bare chip 200, the lens 700 does not necessarily contain a phosphor. In some cases, the lens may contain a phosphor which is different from the phosphor contained in the wavelength converting layer 500.

Thus, according to the present exemplary embodiment, as the LED is packaged using each of the bare chips 200 mounted on the submount substrate 1000, the package design can be more freely performed. Further, the packaging operation is simplified, so that operational efficiency can be enhanced.

Hereinafter, an LED according to an exemplary embodiment of the present invention will be described with reference to FIG. 28.

Unlike the aforementioned exemplary embodiment, the LED of FIG. 22 has, for example, a structure in which the wavelength converting layer 500 comes in contact with the semiconductor stacked structure of the bare chip 200. However, the LED shown in FIG. 28 may be formed so that the wavelength converting layer 500 is spaced apart from the semiconductor stacked structure, i.e., so that a transparent resin 550 is interposed between the wavelength converting layer 500 and the semiconductor stacked structure.

Accordingly, as the wavelength converting layer 500 is spaced apart from the semiconductor stacked structure, it is possible to prevent a resin or a phosphor in the wavelength converting layer 500 from being deteriorated by light generated in the active layer (not shown). In this case, the transparent resin 550 may also be interposed between the wavelength converting layer 500 and an inner surface of the first slit 1110 formed in the submount substrate 1000 (region B of FIG. 28).

Here, in order to reduce heat transferred to the phosphor, the electric conductivity of the transparent resin 550 may be relatively low. For example, the electric conductivity of the transparent resin may be less than 3 W/mK. $TiO_2$, $SiO_2$ or $Y_2O_3$ may be incorporated into the transparent resin so as to control the refractive index of the transparent resin 550.

Alternatively, although not shown in this figure, a high-hardness transparent resin (not shown) having a higher hardness than the transparent resin 550 may be additionally formed on top of the wavelength converting layer 500 so as to cover the wavelength converting layer 500. In this case, the high-hardness transparent resin can protect the phosphor from external moisture. In order to prevent moisture absorption, the high-hardness transparent resin may have, for example, a durometer Shore hardness of 60A or greater. Further, $TiO_2$, $SiO_2$ or $Y_2O_3$ may be incorporated into the high-hardness transparent resin so as to control the refractive index of the high-hardness transparent resin.

As described above, the LED chip and the method of fabricating the same, and a package having the LED chip and the method of fabricating the same according to the present invention are not limited to the aforementioned exemplary embodiments, but may applied to various structures of light emitting devices containing wavelength converting materials.

According to the present invention, it is possible to provide an LED chip capable of performing wavelength conversion even with respect to light emitted through side surfaces of a substrate.

Also, it is possible to provide an LED chip in which additional electrodes are employed, thereby performing wavelength conversion and easily performing wire bonding.

Also, a spacer layer is employed, so that it is possible to prevent a phosphor in a wavelength converting layer from being damaged by light emitted from a semiconductor stacked structure.

Also, the spacer layer includes a DBR, so that it is possible to light converted in the wavelength converting layer from being again incident into the semiconductor stacked structure, thereby improving light efficiency.

Although some exemplary embodiments of the present invention are described for illustrative purposes, it will be apparent to those skilled in the art that various modifications and changes can be made thereto within the scope of the invention without departing from the essential features of the invention. Accordingly, the aforementioned exemplary embodiments should be construed not to limit the technical spirit of the present invention but to be provided for illustrative purposes so that those skilled in the art can fully understand the spirit of the present invention. The scope of the present invention should not be limited to the aforementioned exemplary embodiments but defined by appended claims. The technical spirit within the scope substantially identical with the scope of the present invention will be considered to fall in the scope of the present invention defined by the appended claims.

What is claimed is:

1. light-emitting diode (LED), comprising:
a substrate;
a semiconductor stacked structure disposed on the substrate, the semiconductor stacked structure comprising a first conductivity-type semiconductor layer, an active layer, and a second conductivity-type semiconductor layer;
a wavelength converting layer configured to convert a wavelength of light emitted from the semiconductor stacked structure, the wavelength converting layer covering side surfaces of the substrate and the semiconductor stacked structure; and
a distributed Bragg reflector (DBR) configured to reflect at least a portion of light wavelength-converted by the wavelength converting layer,
wherein at least a portion of the DBR is covered with a metal layer configured to reflect light transmitted through the DBR, and
wherein the DBR comprises alternately stacked insulating layers with different refractive indices.

2. The LED of claim 1, further comprising:
a first electrode disposed on the semiconductor stacked structure and electrically connected to the first conductivity-type semiconductor layer; and
a second electrode disposed on the semiconductor stacked structure and electrically connected to the second conductivity-type semiconductor layer.

3. The LED of claim 2, further comprising:
a first insulating layer disposed on the semiconductor stacked structure; and
a second insulating layer disposed on the first insulating layer,
wherein the first insulating layer contacts a side surface of the second electrode and a side surface of the active layer.

4. The LED of claim 1, further comprising:
a first insulating layer disposed on the semiconductor stacked structure; and
a second insulating layer disposed on the first insulating layer.

5. The LED of claim 4, wherein at least a portion of a side surface of the second insulating layer contacts the wavelength converting layer.

6. The LED of claim 4, wherein a side surface of the second insulating layer is substantially flush with the side surface of the semiconductor stacked structure.

7. The LED of claim 4, further comprising a transparent conductive layer disposed between the first insulating layer and the semiconductor stacked structure.

8. A light-emitting diode (LED) module, comprising:
a mount; and
an LED disposed on the mount, the LED comprising:
a substrate;
a semiconductor stacked structure disposed on the substrate, the semiconductor stacked structure comprising a first conductivity-type semiconductor layer, an active layer, and a second conductivity-type semiconductor layer;
a wavelength converting layer configured to convert a wavelength of light emitted from the semiconductor stacked structure, the wavelength converting layer covering side surfaces of the substrate and the semiconductor stacked structure; and
a distributed Bragg reflector (DBR) configured to reflect at least a portion of light wavelength-converted by the wavelength converting layer,
wherein at least a portion of the DBR is covered with a metal layer configured to reflect light transmitted through the DBR, and
wherein the DBR comprises alternately stacked insulating layers with different refractive indices.

9. The LED module claim 8, wherein the mount comprises at least one of a printed circuit board, a lead frame, and a ceramic substrate.

10. The LED module of claim 9, wherein the mount further comprises lead terminals,
wherein the lead terminals are electrically connected to the first conductivity-type semiconductor layer and the second conductivity-type semiconductor layer.

11. The LED module of claim 8, further comprising a transparent resin disposed on the semiconductor stacked structure,
wherein a portion of the wavelength converting layer is disposed between the semiconductor stacked structure and the transparent resin.

12. The LED module of claim 11, wherein the transparent resin is further disposed on the side surface of the semiconductor stacked structure,
wherein at least a portion of the wavelength converting layer is disposed between the semiconductor stacked structure and the transparent resin.

13. The LED module of claim 11, wherein the transparent resin comprises at least one of $TiO_2$, $SiO_2$, and $Y_2O_3$.

14. The LED module of claim 8, further comprising:
a first electrode disposed on the semiconductor stacked structure and electrically connected to the first conductivity-type semiconductor layer; and
a second electrode disposed on the semiconductor stacked structure and electrically connected to the second conductivity-type semiconductor layer.

15. The LED module of claim 14, wherein the first electrode comprises a lower electrode and an upper electrode disposed on the lower electrode.

16. The LED module of claim 15, further comprising:
a first insulating layer disposed on the semiconductor stacked structure; and
a second insulating layer disposed on the first insulating layer,
wherein at least a portion of the lower electrode passes through the first insulating layer and is electrically connected to the first conductivity-type semiconductor layer.

17. The LED module of claim 15, further comprising:
a first insulating layer disposed on the semiconductor stacked structure; and
a second insulating layer disposed on the first insulating layer,
wherein at least a portion of the second electrode passes through the second insulating layer and is electrically connected to the second conductivity-type semiconductor layer.

18. The LED module of claim 14, further comprising a transparent conductive layer disposed between the second conductivity-type semiconductor layer and the second electrode.

19. The LED module of claim 8, further comprising:
a first insulating layer disposed on the semiconductor stacked structure; and a second insulating layer disposed on the first insulating layer.

* * * * *